(12) United States Patent
Kelly et al.

(10) Patent No.: US 9,553,041 B1
(45) Date of Patent: Jan. 24, 2017

(54) SEMICONDUCTOR DEVICE PACKAGE AND MANUFACTURING METHOD THEREOF

(71) Applicant: Amkor Technology, Inc., Tempe, AZ (US)

(72) Inventors: Michael G. Kelly, Queen Creek, AZ (US); Ronald Patrick Huemoeller, Gilbert, AZ (US); Won Chul Do, Bucheon-si (KR); David Jon Hiner, Chandler, AZ (US)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

(21) Appl. No.: 15/162,424

(22) Filed: May 23, 2016

Related U.S. Application Data

(63) Continuation of application No. 14/698,188, filed on Apr. 28, 2015, now Pat. No. 9,349,681, which is a
(Continued)

(51) Int. Cl.
*H01L 23/29* (2006.01)
*H01L 23/498* (2006.01)
(Continued)

(52) U.S. Cl.
CPC ....... *H01L 23/49827* (2013.01); *H01L 21/486* (2013.01); *H01L 21/561* (2013.01); *H01L 21/6836* (2013.01); *H01L 21/78* (2013.01); *H01L 23/147* (2013.01); *H01L 23/3128* (2013.01); *H01L 23/3675* (2013.01);
(Continued)

(58) Field of Classification Search
None
See application file for complete search history.

(56) References Cited

U.S. PATENT DOCUMENTS

| 6,629,363 B1 | 10/2003 | Chan |
| 7,977,802 B2 | 7/2011 | Pagaila |

(Continued)

OTHER PUBLICATIONS

PCT, Notification of Transmittal of the International Search Report and the Written Opinion of the International Searching Authority, or the Declaration, in International application No. PCT/US13/68510 dated Mar. 28, 2014 (11 pages).
(Continued)

*Primary Examiner* — Angel Roman
(74) *Attorney, Agent, or Firm* — McAndrews, Held & Malloy, Ltd.

(57) ABSTRACT

Methods and systems for a semiconductor device package with a die to interposer wafer first bond are disclosed and may include bonding a plurality of semiconductor die comprising electronic devices to an interposer wafer, and applying an underfill material between the die and the interposer wafer. Methods and systems for a semiconductor device package with a die-to-packing substrate first bond are disclosed and may include bonding a first semiconductor die to a packaging substrate, applying an underfill material between the first semiconductor die and the packaging substrate, and bonding one or more additional die to the first semiconductor die. Methods and systems for a semiconductor device package with a die-to-die first bond are disclosed and may include bonding one or more semiconductor die comprising electronic devices to an interposer die.

20 Claims, 43 Drawing Sheets

Related U.S. Application Data continuation of application No. 13/678,046, filed on Nov. 15, 2012, now Pat. No. 9,040,349, and a continuation of application No. 13/678,058, filed on Nov. 15, 2012, now Pat. No. 9,136,159.

(51) Int. Cl.

| | | |
|---|---|---|
| *H01L 23/14* | (2006.01) | |
| *H01L 23/31* | (2006.01) | |
| *H01L 23/367* | (2006.01) | |
| *H01L 23/538* | (2006.01) | |
| *H01L 23/00* | (2006.01) | |
| *H01L 25/065* | (2006.01) | |
| *H01L 25/16* | (2006.01) | |
| *H01L 25/00* | (2006.01) | |
| *H01L 21/48* | (2006.01) | |
| *H01L 21/56* | (2006.01) | |
| *H01L 21/683* | (2006.01) | |
| *H01L 21/78* | (2006.01) | |
| *H01L 27/108* | (2006.01) | |

(52) U.S. Cl.
CPC .. *H01L 23/49805* (2013.01); *H01L 23/49816* (2013.01); *H01L 23/49838* (2013.01); *H01L 23/5384* (2013.01); *H01L 24/81* (2013.01); *H01L 24/97* (2013.01); *H01L 25/0655* (2013.01); *H01L 25/16* (2013.01); *H01L 25/50* (2013.01); *H01L 27/108* (2013.01); *H01L 23/3135* (2013.01); *H01L 2221/68381* (2013.01); *H01L 2224/73104* (2013.01); *H01L 2224/73204* (2013.01); *H01L 2224/81203* (2013.01)

(56) References Cited

U.S. PATENT DOCUMENTS

| | | |
|---|---|---|
| 8,288,201 B2 | 10/2012 | Pagaila |
| 2004/0150118 A1 | 8/2004 | Honda |
| 2007/0232026 A1 | 10/2007 | Apanius et al. |
| 2007/0287265 A1 | 12/2007 | Hatano et al. |
| 2008/0001276 A1* | 1/2008 | Lee .............. H01L 23/3128 257/686 |
| 2008/0169545 A1 | 7/2008 | Kwon et al. |
| 2009/0200662 A1 | 8/2009 | Ng et al. |
| 2009/0302437 A1 | 12/2009 | Kim et al. |
| 2010/0072594 A1 | 3/2010 | Kerr et al. |
| 2010/0109169 A1 | 5/2010 | Kolan et al. |
| 2010/0133704 A1 | 6/2010 | Marimuthu et al. |
| 2010/0276796 A1 | 11/2010 | Andry et al. |
| 2010/0327419 A1 | 12/2010 | Muthukumar et al. |
| 2011/0308739 A1 | 12/2011 | McCutcheon et al. |
| 2011/0312157 A1 | 12/2011 | Lei et al. |
| 2012/0049339 A1* | 3/2012 | Wang ............... H01L 21/563 257/693 |
| 2012/0074585 A1 | 3/2012 | Koo et al. |
| 2012/0146177 A1 | 6/2012 | Choi et al. |
| 2012/0175767 A1 | 7/2012 | Hung |
| 2012/0193779 A1 | 8/2012 | Lee et al. |
| 2012/0211885 A1 | 8/2012 | Choi et al. |
| 2012/0228749 A1 | 9/2012 | Pagaila |
| 2012/0238057 A1 | 9/2012 | Hu et al. |
| 2012/0241965 A1 | 9/2012 | Hu et al. |
| 2013/0032947 A1* | 2/2013 | Park ............... H01L 21/568 257/774 |
| 2013/0175686 A1* | 7/2013 | Meyer ............. H01L 25/0655 257/738 |
| 2013/0187258 A1 | 7/2013 | Lu et al. |
| 2013/0217188 A1 | 8/2013 | Wang et al. |
| 2013/0249106 A1 | 9/2013 | Lin et al. |
| 2014/0001652 A1 | 1/2014 | Chen et al. |
| 2014/0134796 A1 | 5/2014 | Kelly et al. |
| 2014/0134804 A1 | 5/2014 | Kelly et al. |

OTHER PUBLICATIONS

PCT, Notification of Transmittal of the International Search Report and the Written Opinion of the International 1 Searching Authority, or the Declaration, in International application No. PCT/US13/68521 dated Apr. 7, 2014 (22 pages).

PCT, Notification Concerning Transmittal of International Preliminary Report on Patentability, in application No. PCT/US2013/068510, dated May 28, 2015 (6 pages).

* cited by examiner

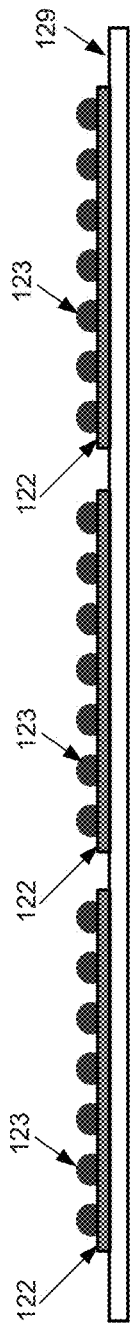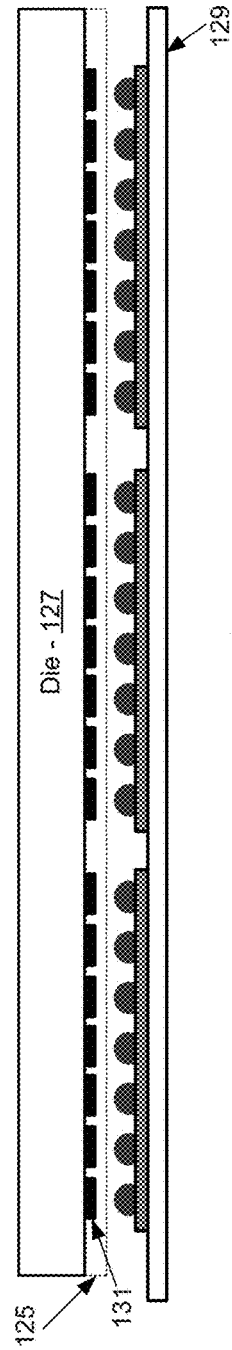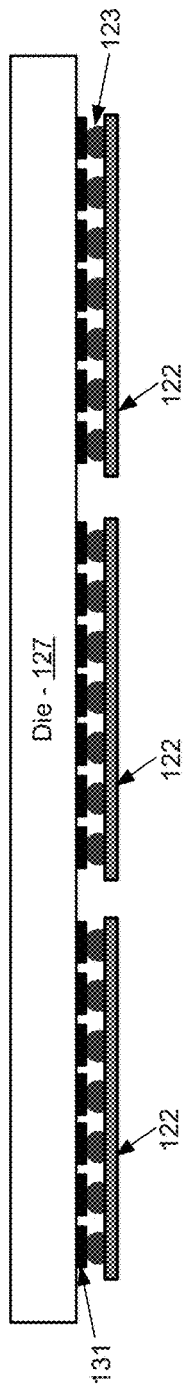

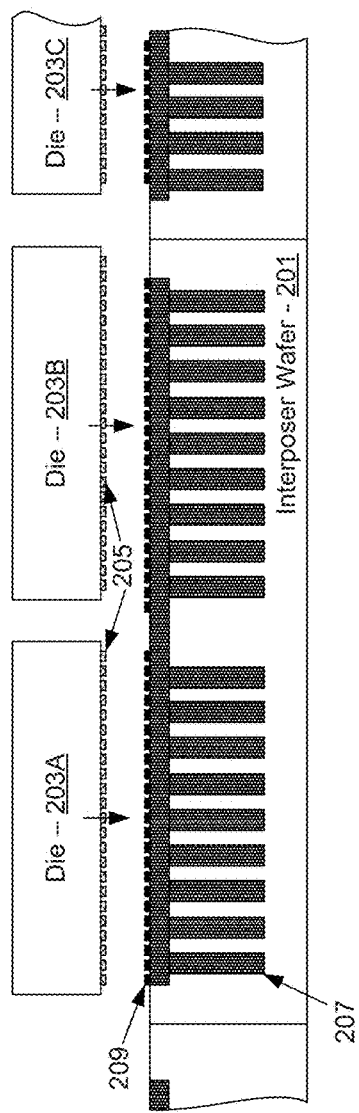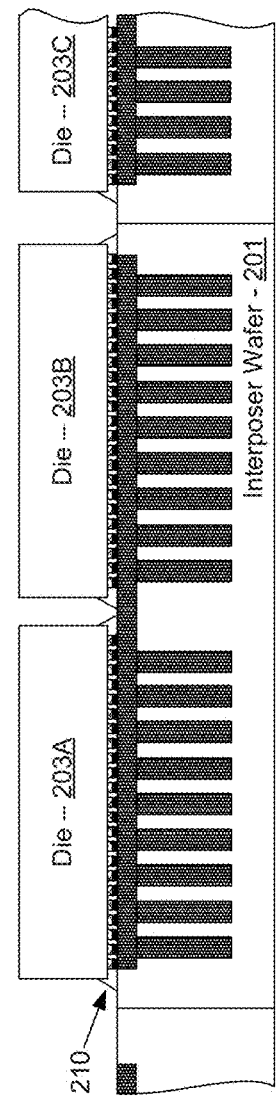
FIG. 2A
FIG. 2B

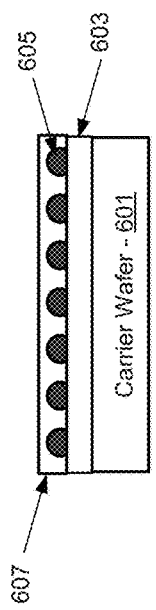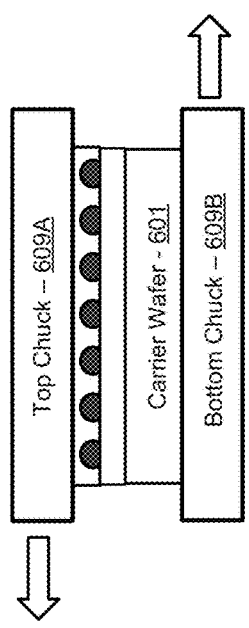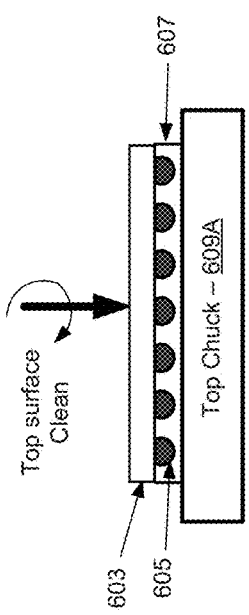

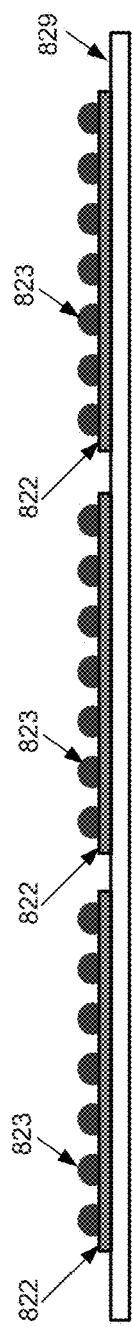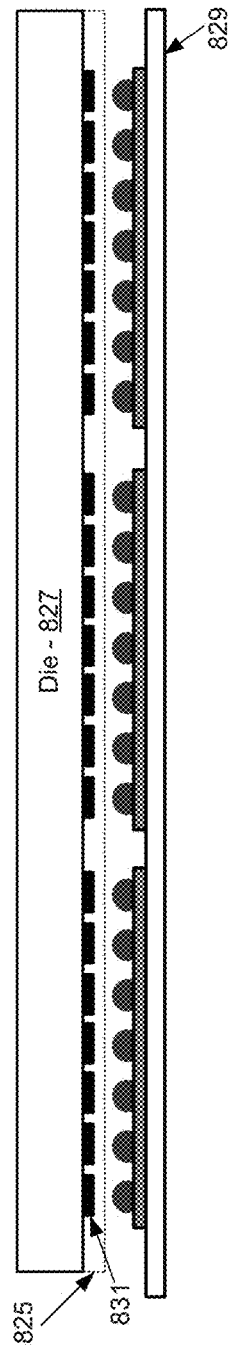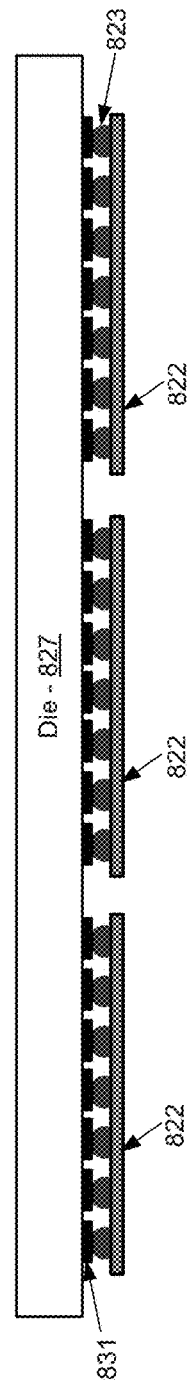

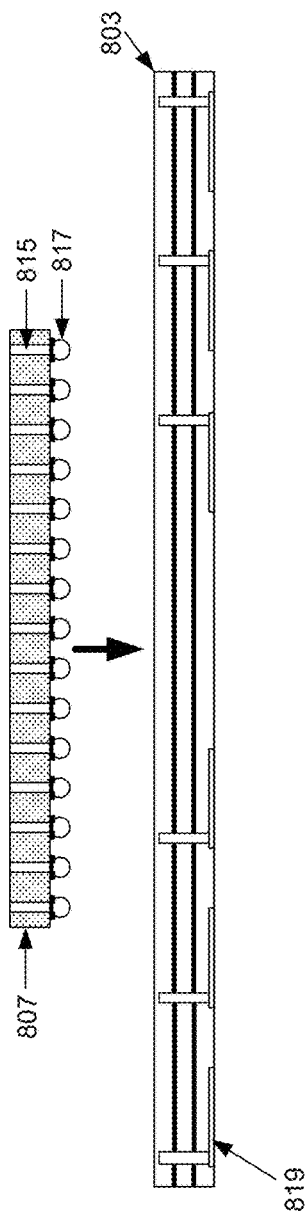
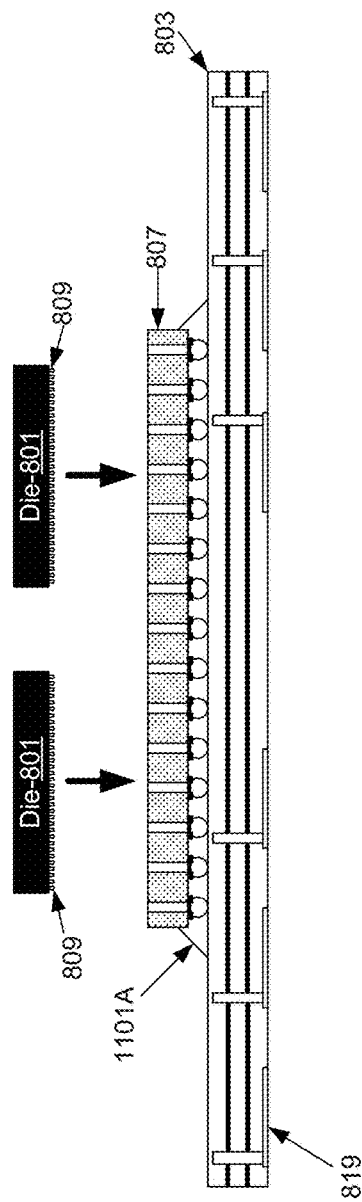

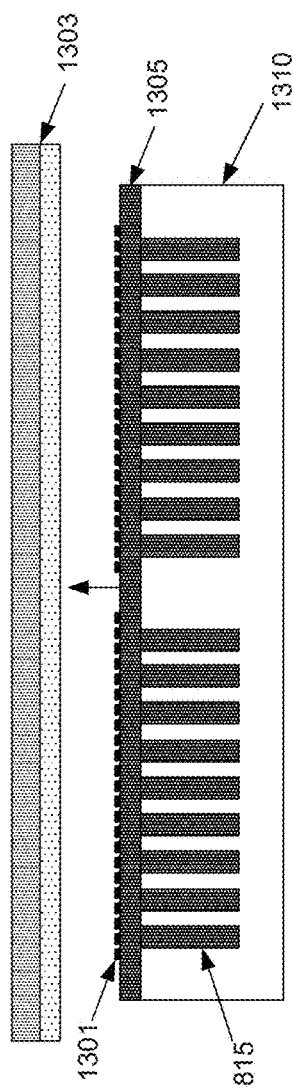
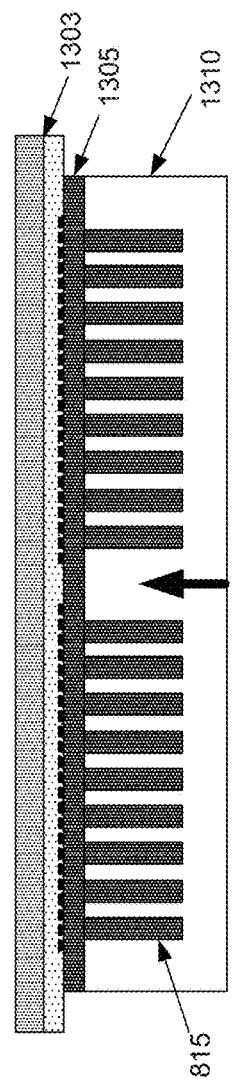
FIG. 13A
FIG. 13B

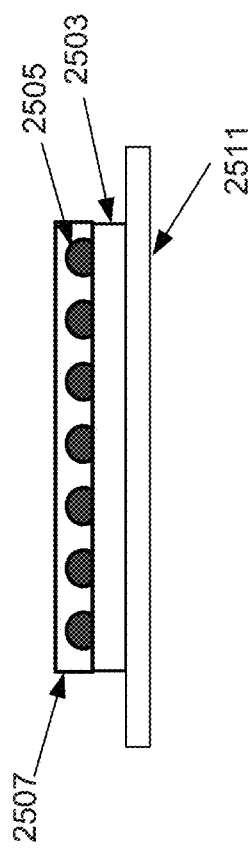
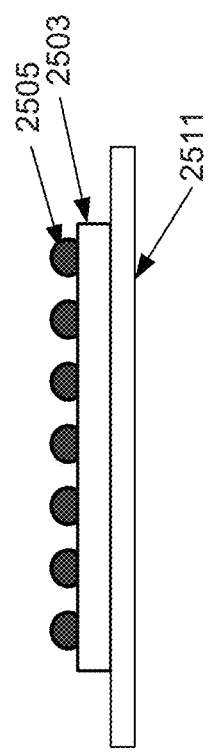
FIG. 25D
FIG. 25E

SEMICONDUCTOR DEVICE PACKAGE AND MANUFACTURING METHOD THEREOF

CROSS-REFERENCE TO RELATED APPLICATIONS/INCORPORATION BY REFERENCE

This application is a continuation of U.S. patent application Ser. No. 14/698,188, filed on Apr. 28, 2015, expected to issue as U.S. Pat. No. 9,349,681 on May 24, 2016, and titled "SEMICONDUCTOR DEVICE PACKAGE AND MANUFACTURING METHOD THEREOF," which is a continuation of U.S. patent application Ser. No. 13/678,046, filed on Nov. 15, 2012, now U.S. Pat. No. 9,040,349 issued May 26, 2015, and titled "METHOD AND SYSTEM FOR A SEMICONDUCTOR DEVICE PACKAGE WITH A DIE TO INTERPOSER WAFER FIRST BOND," and a continuation of U.S. patent application Ser. No. 13/678,058, filed on Nov. 15, 2012, now U.S. Pat. No. 9,136,159 issued Sep. 15, 2015, and titled "METHOD AND SYSTEM FOR A SEMICONDUCTOR DEVICE PACKAGE WITH A DIE-TO-PACKAGING SUBSTRATE FIRST BOND," the entire contents of each of which are hereby incorporated herein by reference in their entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

FIELD OF THE INVENTION

Certain embodiments of the invention relate to semiconductor chip packaging. More specifically, certain embodiments of the invention relate to a method and system for a semiconductor device package with a die-to-interposer-wafer first bond. Also, certain embodiments of the invention relate to a method and system for a semiconductor device package with a die-to-packaging substrate first bond. Additionally, certain embodiments of the invention relate to a method and system for a semiconductor device package with a die-to-die first bond.

BACKGROUND OF THE INVENTION

Semiconductor packaging protects integrated circuits, or chips, from physical damage and external stresses. In addition, it can provide a thermal conductance path to efficiently remove heat generated in a chip, and also provide electrical connections to other components such as printed circuit boards, for example. Materials used for semiconductor packaging typically comprises ceramic or plastic, and form-factors have progressed from ceramic flat packs and dual in-line packages to pin grid arrays and leadless chip carrier packages, among others.

Further limitations and disadvantages of conventional and traditional approaches will become apparent to one of skill in the art, through comparison of such systems with the present invention as set forth in the remainder of the present application with reference to the drawings.

BRIEF DESCRIPTION OF SEVERAL VIEWS OF THE DRAWINGS

FIGS. 1C-1E illustrate example steps for bonding multiple die utilizing an adhesive film, in accordance with an example embodiment of the invention.

FIGS. 2A-2F illustrate example steps in a die to interposer wafer first bond structure, in accordance with an example embodiment of the invention.

FIGS. 6A-6E illustrate example steps for debonding wafers with large backside bumps, in accordance with an example embodiment of the invention.

FIGS. 8C-8E illustrate steps for bonding multiple die utilizing an adhesive film, in accordance with an example embodiment of the invention.

FIGS. 11A-11C illustrate a process for an interposer-to-packaging substrate first bond, in accordance with an example embodiment of the invention.

FIGS. 13A-13B illustrate initial steps in an interposer fabrication process, in accordance with an example embodiment of the invention.

FIGS. 25A-25E illustrate steps for debonding wafers with large backside bumps, in accordance with an example embodiment of the invention.

DETAILED DESCRIPTION OF VARIOUS ASPECTS OF THE DISCLOSURE

The following discussion presents various aspects of the present disclosure by providing various examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

Certain aspects of the invention may be found in a method and system for a semiconductor device package with a die to interposer wafer first bond. Example aspects of the invention may comprise bonding a plurality of semiconductor die comprising electronic devices to an interposer wafer, and applying an underfill material between the plurality of semiconductor die and the interposer wafer. A mold material may be applied to encapsulate the plurality of semiconductor die. The interposer wafer may be thinned to expose through-silicon-vias (TSVs) and metal contacts may be applied to the exposed TSVs. The interposer wafer may be singulated to generate a plurality of assemblies each comprising one or more of the plurality of semiconductor die and an interposer die. The one or more of the plurality of assemblies may be bonded to one or more packaging substrates. The plurality of die may be placed on the interposer wafer for the bonding utilizing an adhesive film. The interposer wafer may be singulated utilizing one or more of: a laser cutting process, reactive ion etching, a sawing technique, and a plasma etching process. The underfill material may be applied utilizing a capillary underfill process. The plurality of semiconductor die may be bonded to the interposer wafer utilizing a mass reflow process or a thermal compression process. The one or more additional die may be bonded to the plurality of semiconductor die utilizing a mass reflow process or a thermal compression process. The mold material may comprise a polymer. The one or more additional die may comprise micro-bumps for coupling to the plurality of semiconductor die.

Figure 1A:
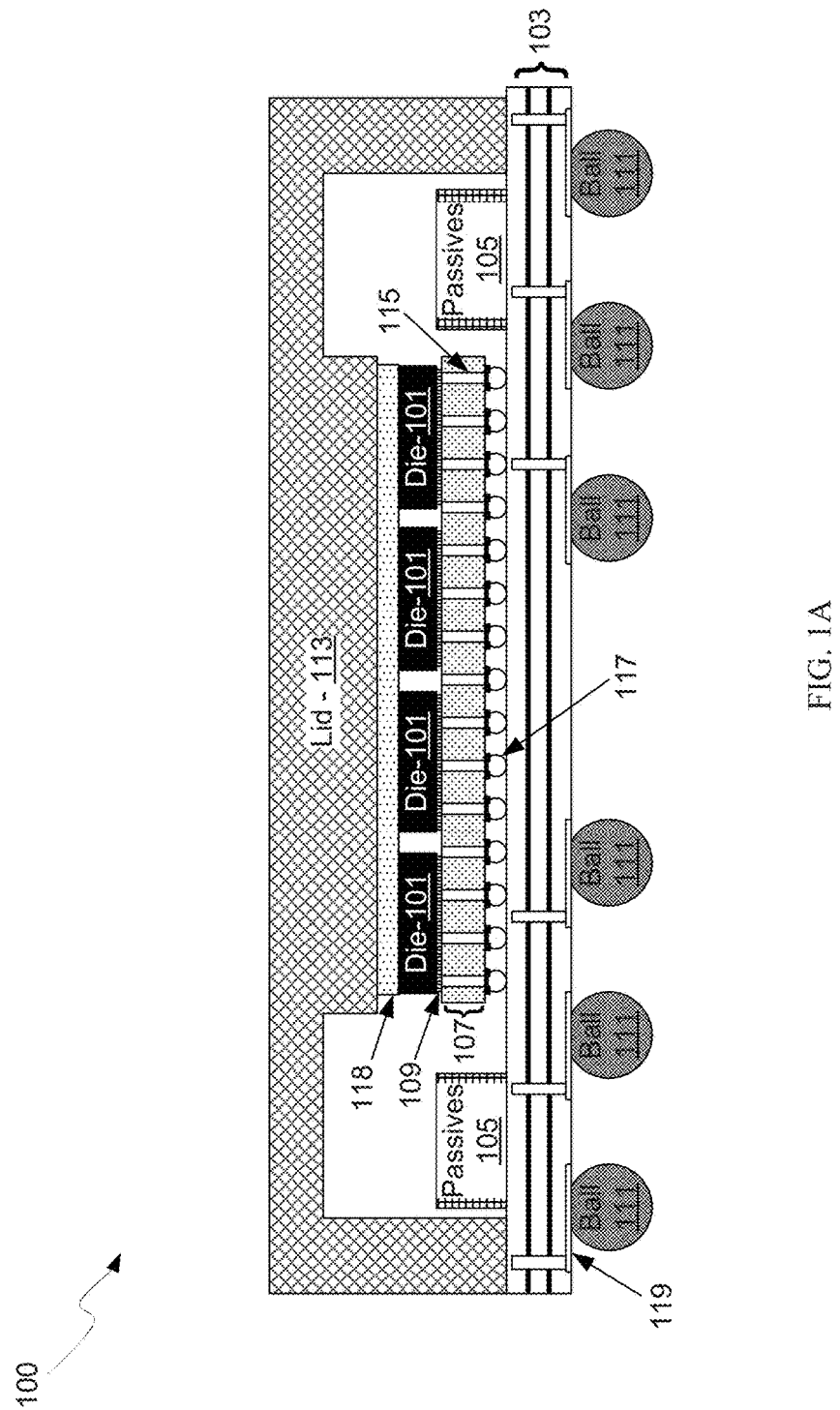
FIG. 1A is a schematic illustrating an integrated circuit package configured with a die-to-wafer first bond, in accordance with an example embodiment of the invention.

FIG. 1A is a schematic illustrating an integrated circuit package configured with a die-to-wafer first bond, in accordance with an example embodiment of the invention. Referring to FIG. 1A, there is shown a package 100 comprising die 101, a packaging substrate 103, passive devices 105, an interposer 107, solder balls 111, a lid 113, and thermal interface material 118.

The die 101 may comprise integrated circuit die that have been separated from one or more semiconductor wafers. The die 101 may comprise electrical circuitry such as digital signal processors (DSPs), network processors, power management units, audio processors, RF circuitry, wireless baseband system-on-chip (SoC) processors, sensors, and application specific integrated circuits, for example. In addition, the die 101 may comprise micro-bumps 109 for providing electrical contact between the circuitry in the die 101 and contact pads on the surface of the interposer 107.

The interposer 107 may comprise a semiconductor wafer, such as a silicon wafer, with through-silicon-vias (TSVs) 115 that provide electrically conductive paths from one surface of the interposer 107 to the opposite surface. The interposer 107 may also comprise backside bumps 117 for making electrical and mechanical contact to the packaging substrate 103. In another example scenario, the interposer 107 may comprise glass or an organic laminate material, either of which may be capable of large panel formats on the order of 500×500 mm, for example.

The packaging substrate 103 may comprise a mechanical support structure for the interposer 107, the die 101, the passive devices 105, and the lid 113. The packaging substrate 103 may comprise solder balls 111 on the bottom surface for providing electrical contact to external devices and circuits, for example. The packaging substrate 103 may also comprise conductive traces in a non-conductive material for providing conductive paths from the solder balls to the die 101 via pads that are configured to receive the backside bumps 117 on the interposer 107. Additionally, the packaging substrate 103 may comprise pads 119 for receiving the solder balls 111. The pads 119 may comprise one or more under-bump metals, for example, for providing a proper electrical and mechanical contact between the packaging substrate 103 and the solder balls 111.

The passive devices 105 may comprise electrical devices such as resistors, capacitors, and inductors, for example, which may provide functionality to devices and circuits in the die 101. The passive devices 105 may comprise devices that may be difficult to integrate in the integrated circuits in the die 101, such as high value capacitors or inductors. In another example scenario, the passive devices 105 may comprise one or more crystal oscillators for providing one or more clock signals to the die 101.

The lid 113 may provide a hermetic seal for the devices within the cavity defined by the lid 110 and the packaging substrate 103. A thermal interface may be created for heat transfer out of the die 101 to the lid 113 via the thermal interface material 118, which may also act as an adhesive.

In an example scenario, the package 100 may be fabricated by first bonding the die 101 to the interposer 107 when the interposer is still part of a full wafer of interposer die, and may be bonded utilizing a mass reflow or thermal compression process. The interposer wafer with attached die 101 may be processed for further assembly. For example, the interposer wafer may be thinned and the backside bumps 117 may be deposited. Furthermore, a capillary underfill material may be placed between the die 101 and the interposer before a mold process is utilized to encapsulate the die 101 on the individual interposer die in the interposer wafer.

An assembly comprising the die 101 and the interposer wafer may be singulated and the singulated assembly may then be bonded to the packaging substrate 103 utilizing either mass reflow or thermal compression. The lid 113 may be placed on the bonded assembly to provide a hermetic seal and protect the circuitry from the external environment. Finally, electrical tests may be performed following the bonding processes to verify that proper electrical connections were made and no shorts or open circuits exist.

Figure 1B:
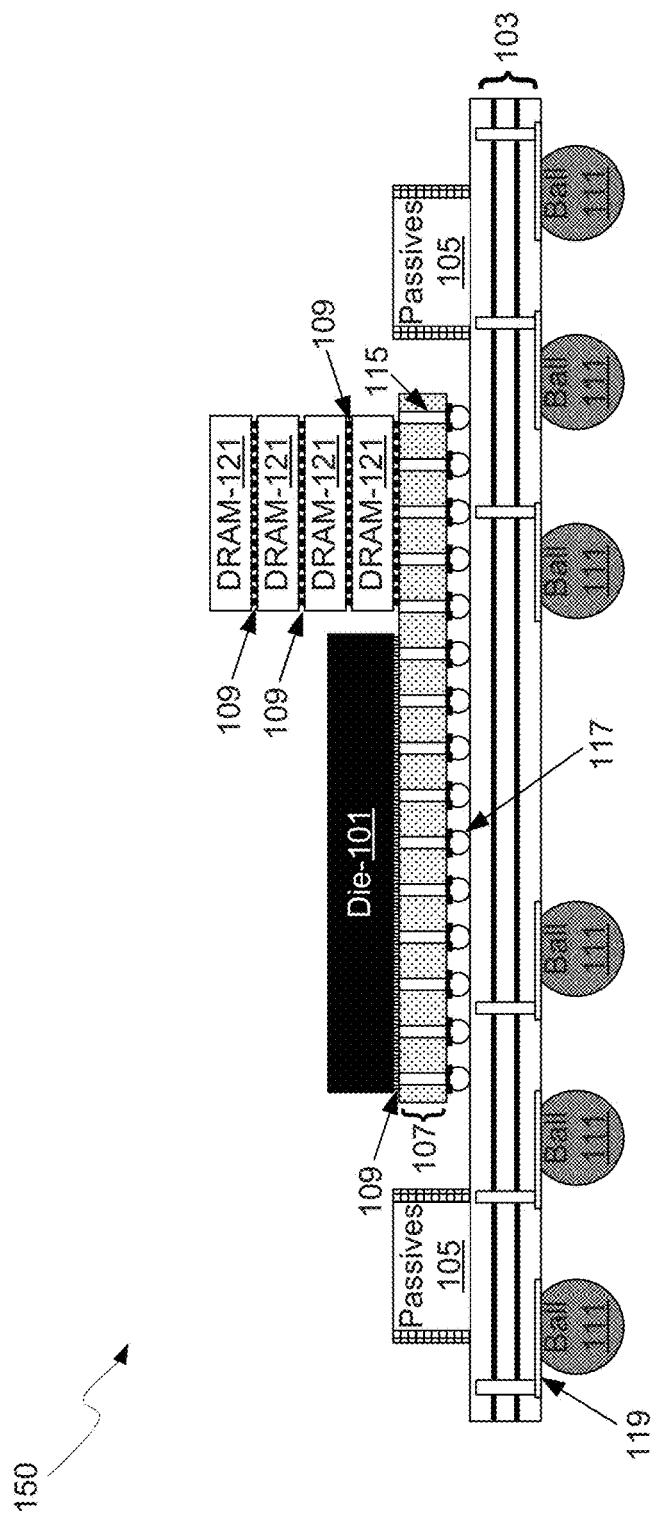
FIG. 1B is a schematic illustrating an integrated circuit package configured with a die to interposer wafer first bond and stacked die, in accordance with an example embodiment of the invention.

FIG. 1B is a schematic illustrating an integrated circuit package configured with a die to interposer wafer first bond and stacked die, in accordance with an example embodiment of the invention. Referring to FIG. 1B, there is shown a package 150 comprising the die 101, the packaging substrate 103, the passive devices 105, the interposer 107, and a stack of dynamic random access memory (DRAM) 121. The die 101, the packaging substrate 103, the passive devices 105, and the interposer 107 may be substantially as described with respect to FIG. 1A, for example, but with different electrical connectivity for the different die 101 and the stack of DRAM 121.

The DRAM 121 may comprise a stack of die for providing a high density memory for circuitry in the die 101 or external to the package 150. The DRAM 121 may be stacked front-to-back and therefore comprise TSV's for providing electrical connectivity between the individual die.

In an example scenario, the package 150 may be fabricated by first bonding the die 101 and the DRAM 121 to the interposer 107 when still in wafer form, i.e. before singulation into individual interposer die. The die 101 and the DRAM 121 may be bonded utilizing mass reflow or thermal compression process. The interposer wafer and bonded die may be singulated into separate functional die/interposer die assemblies before being bonded to the packaging substrate 103. Furthermore, a capillary underfill process may follow the bonding processes for mechanical and insulating purposes. Electrical tests may be performed following the bonding processes to verify that proper electrical connections were made and no shorts or open circuits exist.

FIGS. 1C-1E illustrate example steps for bonding multiple die utilizing an adhesive film, in accordance with an example embodiment of the invention. Referring to FIG. 1C, there is shown a plurality of die 122 and an adhesive layer 129. Each of the plurality of die 122 may comprise metal interconnects 123 for subsequent bonding to other die. In another example scenario, the metal interconnects 123 may comprise microbumps or copper pillars, for example.

The adhesive film 129 may comprise an adhesive tape or compliant layer, for example, to which the plurality of die 122 may be bonded, as illustrated in FIG. 1C. The adhesive film 129 may be a temporary adhesive for attaching multiple die to other die within a wafer. For example, the interposer 127 may comprise a wafer of individual interposer die (in which case the interposer 127 comprises an "interposer wafer"). In an example scenario, the plurality of die 122 may be placed temporarily on the adhesive film 129. While FIG. 1C illustrates the plurality of die 122 as consisting of three die, more or less die (including a single die) are also possible and contemplated.

An optional underfill material 125 may also be placed on the interposer wafer 127 as illustrated by underfill material 125 in FIG. 1D, before bonding the plurality of die 122 to the interposer 127 utilizing the adhesive film 129. The underfill material 125 may be for subsequent thermal compression bonding processes, for example, and may allow instant underfill through a snap cure during a subsequent thermal compression bonding process. This may improve bonding yields since a single underfill process may be utilized for the plurality of die 122 as compared to a separate place and underfill process for each of the die 122. The plurality of die 122 may be placed face up so that the metal interconnects 123 may be coupled to a receiving die.

The plurality of die 122 on the adhesive film 129 may then be placed on the interposer 127, as shown in FIGS. 1D and 1E, where the initial placement of the plurality of die 122 on the adhesive film 129 may enable fine control of the spacing and alignment of the plurality of die 122 with the interposer 127. In an example scenario, the interposer 127 may be gang bonded to the individual die 122. The interposer 127 may comprise metal pads 131 for receiving the metal interconnects 123. Once the plurality of die 122 are placed on the interposer 127, a thermal compression bond process may be performed for proper electrical and mechanical bonds between the metal interconnects 123 and the metal pads 131. Once bonded, the adhesive film 129 may be removed resulting in the structure shown in FIG. 1E.

Figure 2C:
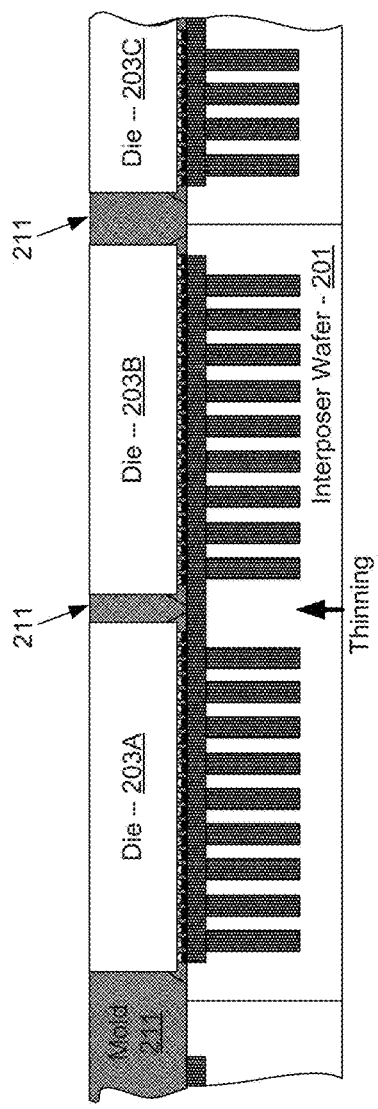

FIGS. 2A-2F illustrate example steps in a die to interposer wafer first bond structure, in accordance with an example embodiment of the invention. Referring to FIG. 2A, there is shown an interposer wafer 201 and a plurality of die 203A-203C. The die 203A-203C may comprise integrated circuit die that have been separated from one or more semiconductor wafers. The die 203A-203C may comprise electrical circuitry such as digital signal processors (DSPs), network processors, power management units, audio processors, RF circuitry, wireless baseband system-on-chip (SoC) processors, sensors, and application specific integrated circuits, for example. In addition, the die 203A-203C may comprise micro-bumps 205 for providing electrical contact between the circuitry in the die 203A-203C and front side pads 209 on the surface of the interposer wafer 201.

The interposer wafer 201 may comprise a plurality of individual interposer die, each of which may be coupled to one or more die, such as the die 203A-203C. The interposer wafer 201 may also comprise front side pads 209 for providing electrical contact to the die 203A-203C. Furthermore, the interposer wafer 201 may comprise through-silicon-vias (TSVs) 207 for providing electrically conductive paths from one surface of the interposer to the other, once the interposer wafer 201 has been thinned.

The die 203A-203C may be placed on the interposer wafer 201 and bonded using a thermal compression bonding technique, for example. In another example scenario, a mass reflow process may be utilized to bond the die 203A-203C. A non-conductive paste (NCP) may also be utilized to assist in forming the bonds. In addition, a capillary underfill may then be applied and may fill the volume between the die 203A-203C and the interposer wafer 201. FIG. 2B illustrates the die 203A-203C bonded to the interposer wafer 201 with underfill material 210. When deposited or placed, the underfill material 210 may comprise a film, paste, b-stage film, or a liquid, for example.

The space between the die 203A-203C may be filled with a mold material 211, as illustrated in FIG. 2C. The mold material 211 may comprise a polymer material, for example, that may provide a non-conductive structural support for die bonded to the interposer wafer 201, protecting the die in subsequent processing steps and when diced into individual packages. In an example scenario, the interposer wafer 201 may be thinned utilizing a back side polish or grind, for example, to expose the TSVs.

While the underfill material 210 is shown in FIGS. 2B-2F, the mold material itself may be utilized as underfill material for each coupling interface, such as between the die 203A and 203B and the interposer wafer 201. In another example embodiment, underfill material may be inserted as a liquid or paste, placed as a film, or a b-staged film and may be placed sequentially as each die to substrate or die to die bond is made, or may be made all at one time after all the electrical bonds are made.

In another example scenario, the interposer wafer 201 may be thinned to a thickness where the TSVs are still slightly covered, which may then be etched selectively in areas covering the TSVs. A protective layer may then be deposited over the remaining silicon and a polish of the exposed TSVs may be performed for improved contact to the TSVs. Additionally, metal pads may be deposited on the polished TSVs for better contact with the backside bumps 213.

Figure 2D:
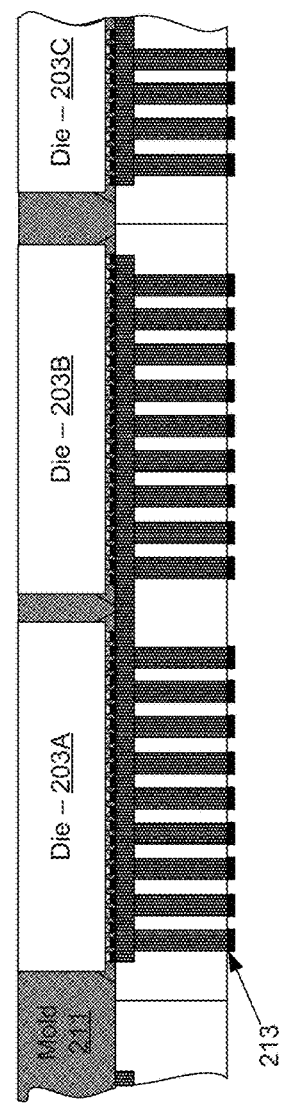

After the interposer wafer 201 has been thinned, the backside bumps 213 may be deposited, as shown in FIG. 2D, for making contact between the TSVs and subsequently bonded substrates, such as packaging substrates.

The molded assembly may then be singulated utilizing a cutting technology such as reactive ion etching, plasma etching (e.g. an inductively coupled plasma), laser cutting, or mechanical saw. In an example scenario, the molded assembly may be partially cut and then separated with a mechanical pulling apart of the die.

Figure 2E:
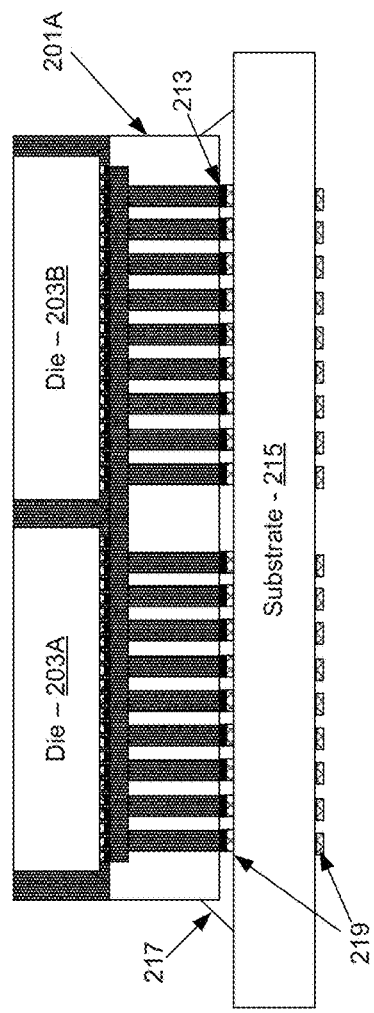
Figure 2F:
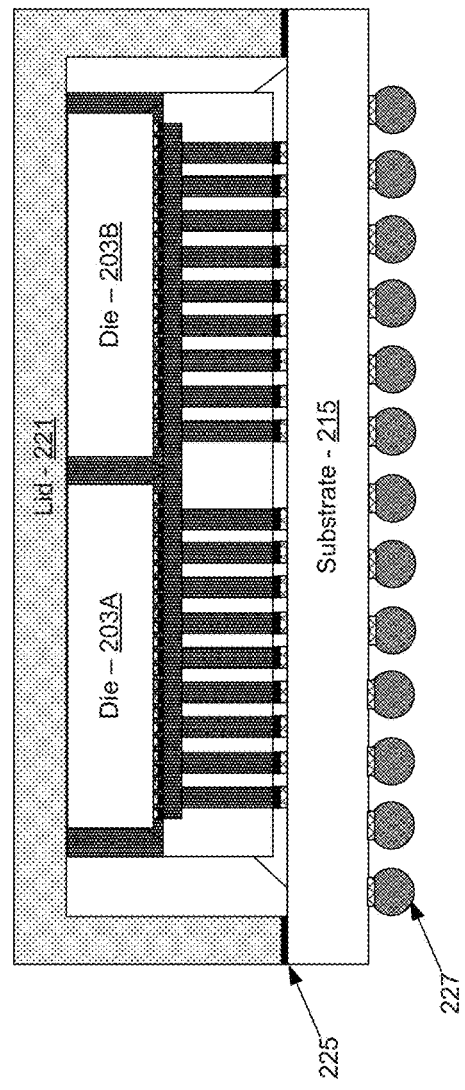

The singulated molded die/interposer assembly comprising the die 203A-203B and the interposer die 201A may then be bonded to the packaging substrate 215 via the backside bumps 213, as illustrated in FIG. 2E. The packaging substrate 215 may comprise contact pads 219 for making contact with the backside bumps 213 on the interposer die 201A and for subsequent placement of solder balls 227 as shown in FIG. 2F.

In addition, the lid 221 may be placed on the package assembly with a hermetic seal made with an adhesive 225 at the surface of the packaging substrate 215, which may also comprise a thermal interface material. Accordingly, the lid 221 may make contact with the top surfaces of the die 203A and 203B for thermal heat sinking purposes. The solder balls 227 may comprise metal spheres for making electrical and mechanical contact with a printed circuit board, for example.

Figure 3:
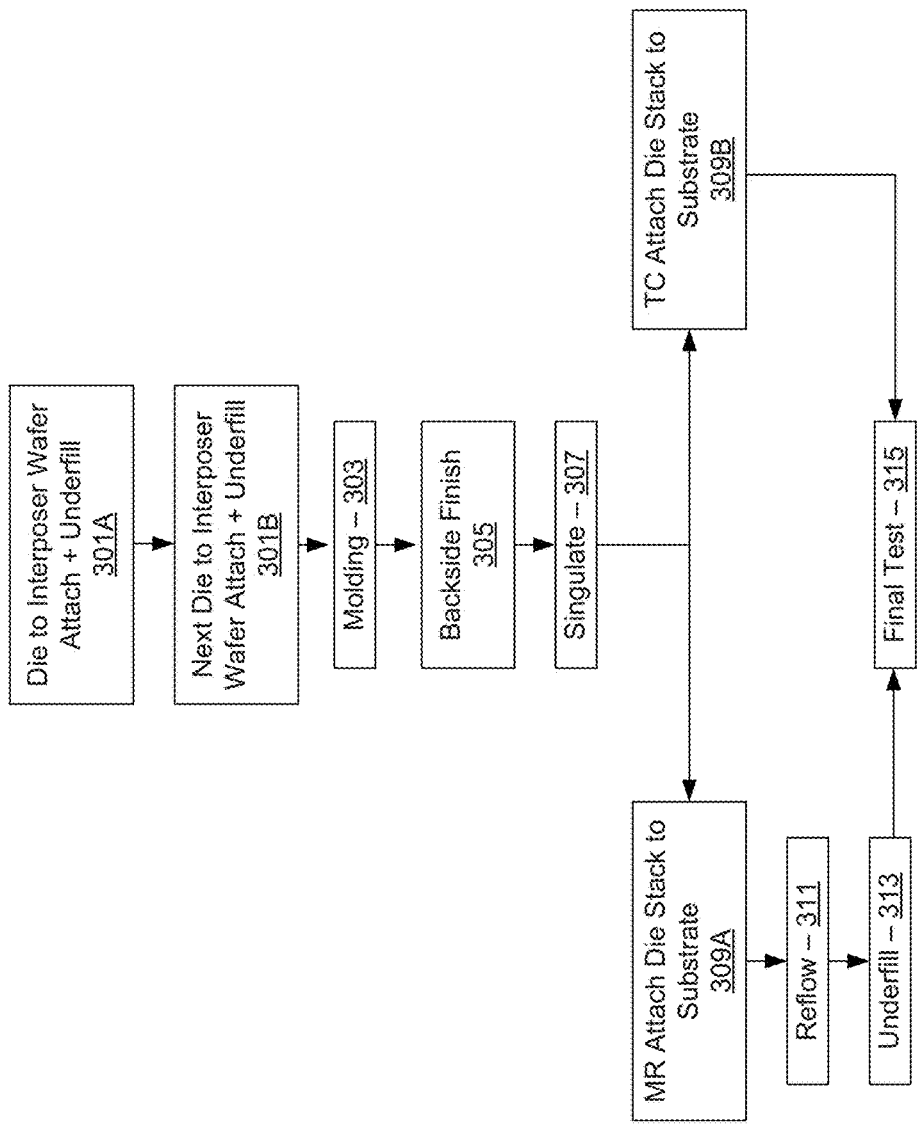
FIG. 3 is a schematic illustrating example steps in a die to interposer wafer first bond process, in accordance with an example embodiment of the invention.

FIG. 3 is a schematic illustrating example steps in a die to interposer wafer first bond process, in accordance with an example embodiment of the invention. Referring to FIG. 3, there is shown a die to interposer wafer process beginning with a die to interposer wafer attach and underfill step 301A. The one or more die may be bonded utilizing a thermal compression bonding technique, for example. Additional die may also be bonded to the first bonded die, such as illustrated by the DRAM stack 121 shown in FIG. 1B, or the interposer wafer as shown in FIG. 1A, in the next die to interposer wafer attach and underfill step 301B.

A capillary underfill process may be utilized following the bonding process, which may provide an insulating barrier between contacts and may fill the volume between the die and the interposer wafer. It should be noted that the process is not limited to a thermal compression technique. Accordingly, a mass reflow process may be utilized, for example. Thermal compression bonding techniques may be advantageous at 40 micron pitch or less and white bumps, i.e. high-k dielectric layer delamination, may be eliminated with thermal compression bonding. In addition, flatness may be improved with thermal compression bonding, resulting in fewer open circuit connections due to excessive gaps.

A molding step 303 may then be utilized to package the die/interposer assembly before thinning the interposer substrate to expose the TSVs in the backside finish step 305. In addition, backside contacts may be applied to the exposed TSVs in the interposer wafer.

The molded die/interposer wafer assembly may then be singulated into a plurality of molded die on interposer die assemblies in the singulate step 307. Singulation may be performed via laser cutting, plasma etching, reactive ion etching, or a sawing technique, for example.

The singulated assemblies may then be attached to packaging substrates, utilizing either a mass reflow technique in step 309A or a thermal compression technique in step 309B, utilizing the deposited backside contacts. If the mass reflow bonding step 309A is utilized, the die/interposer/packaging substrate assembly may then be subjected to a reflow step 311 where the interposer die to packaging substrate contacts may be reflowed resulting in proper electrical and physical contact. This may be followed by a capillary underfill process at step 313 where the volume between the interposer die and the packaging substrate is underfilled, for example providing an insulating material between the contacts and filling the void to reject contamination.

If the singulated assembly is bonded to a packaging substrate utilizing a thermal compression technique in step 309B, the bonded assembly may proceed to step 315. Note that the thermal compression technique in step 309B may, for example, include applying a pre-applied underfill before thermal compression. In another example scenario, such underfill may also be applied after step 309B, for example in a process analogous to step 313.

Finally, the bonded package may be subjected to a final test step 315 for assessing the performance of the electronic circuitry in the bonded die and to test the electrical contacts made in the bonding processes.

Figure 4:
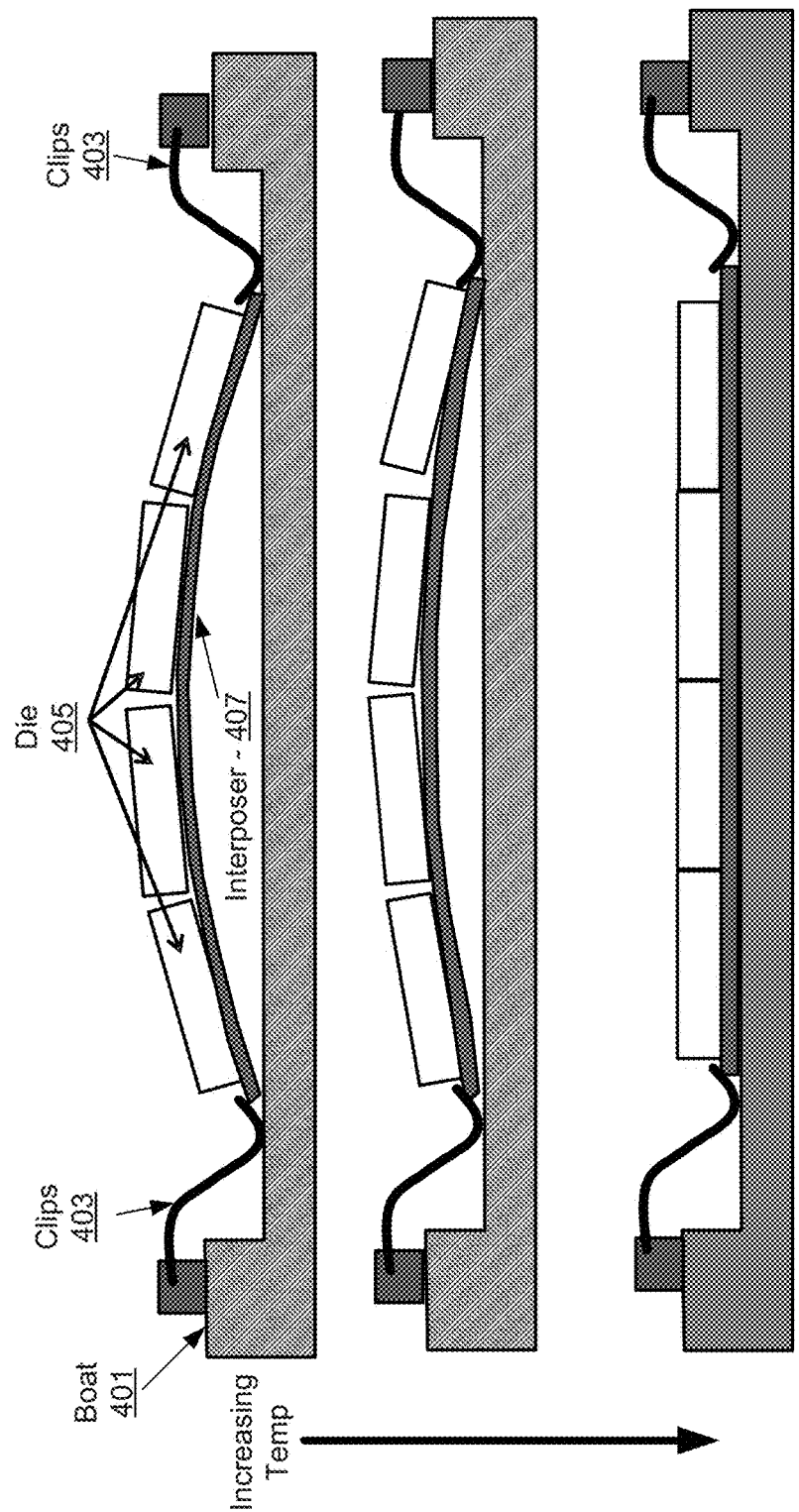
FIG. 4 is a diagram illustrating a mechanical planarizing apparatus, in accordance with an example embodiment of the invention.

FIG. 4 is a diagram illustrating a mechanical planarizing apparatus, in accordance with an example embodiment of the invention. Referring to FIG. 4, there is shown a boat 401, clips 403, a plurality of die 405, and an interposer 407. The boat 401 may comprise a rigid support structure in which a die/interposer assembly, where the interposer 407 may be in wafer form, may be placed and held in place by the clips 403. The boat 401 may be capable of withstanding high temperatures, above 200 C, for example used for processing the die/interposer assembly.

The plurality of die 405 may be bonded to the interposer 407 via a thermal compression bonding, technique, for example, prior to being placed in the boat 401. As the temperature of the boat 401 the plurality of die 405, and the interposer 407 increases, the curvature of an assembly comprising the plurality of die 405 and the interposer 407 may flatten with the clips 403 providing a downward force at the outer edges of the assembly. As the curvature approaches zero, the increased length in the lateral direction may be accommodated by sliding under the clips 403. In addition, the boat 401 provides mechanical support in conjunction with the downward force of the clips 403, thereby planarizing the assembly.

The boat 401 and clips 403 may permit the partially assembled package to heat up in normal fashion, but when the die/interposer assembly has become flat with increased temperature, the boat 401 and clips 403 resist the normal progression of the warpage, holding the partially assembled package, flattening it during heating and then maintaining that flatness of the silicon interposer as temperatures climb higher.

Figure 5:
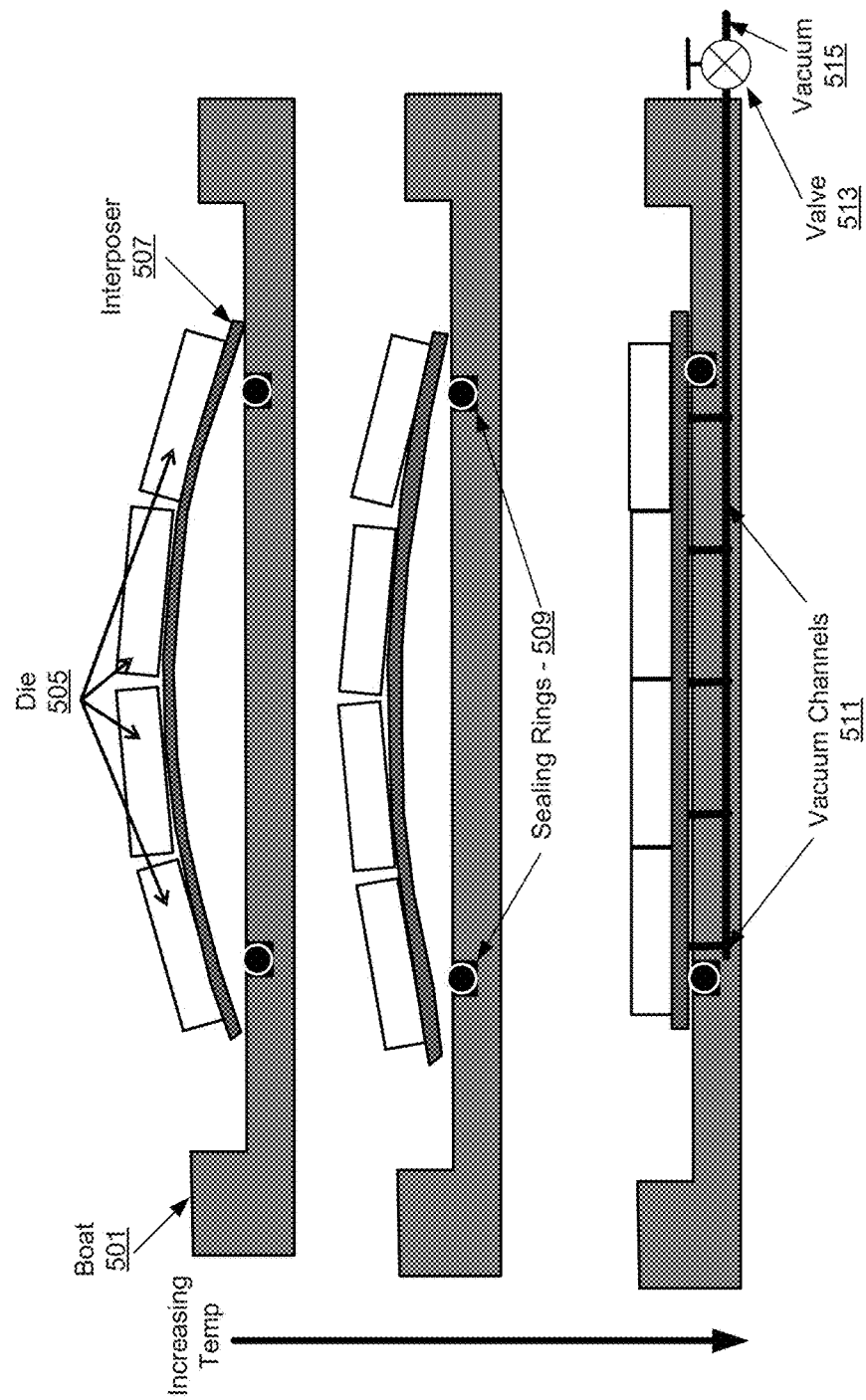
FIG. 5 is a diagram illustrating a vacuum planarizing apparatus, in accordance with an example embodiment of the invention.

FIG. 5 is a diagram illustrating a vacuum planarizing apparatus, in accordance with an example embodiment of the invention. Referring to FIG. 5, there is shown a boat 501, a plurality of die 505, an interposer 507, vacuum sealing rings 509, vacuum channels 511, a valve 513, and a vacuum supply 515.

In an example scenario, the boat 501 comprises a vacuum system to flatten the partially assembled package comprising the plurality of die 505 and the interposer 507. In an example scenario, the boat 501 may accept die/interposer assemblies when the interposer 507 is still in wafer form. The vacuum-mechanical system permits the partially assembled package to heat up in normal fashion, but when the partially assembled package has become flat, the vacuum-mechanical system resists the normal progression of the warpage, holding the partially assembled package in a flattened configuration during heating and then maintains that flatness of the silicon interposer 507 as temperatures increases.

The vacuum may be applied at room temperature or slightly elevated temperatures utilizing the vacuum supply 515 via the valve 513 and the vacuum channels 511, and may be held utilizing the high-temperature sealing rings 509 so that the vacuum-mechanical boat 501 may travel through a standard reflow furnace and still maintain sufficient vacuum to maintain interposer silicon top surface planarity.

Figure 6D:
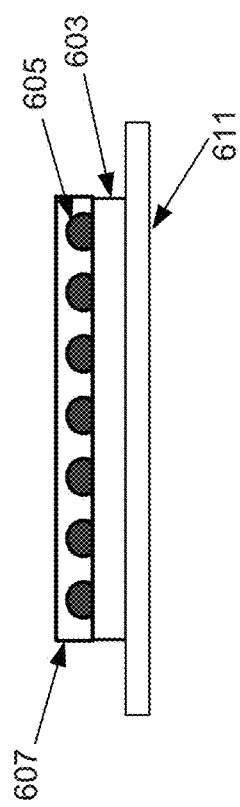
Figure 6E:
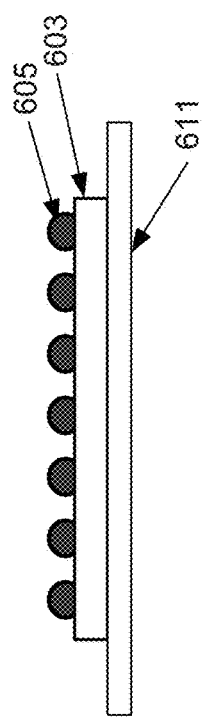

FIGS. 6A-6E illustrate example steps for debonding wafers with large backside bumps, in accordance with an example embodiment of the invention. Referring to FIG. 6A, there is shown a carrier wafer 601, a wafer 603 with backside bumps 605, and a polymer layer 607.

The wafer 603 may comprise an electronics, or functional, wafer or an interposer wafer, for example, which may comprise large backside bumps 605 that may be susceptible to damage in debond processes. Accordingly, the polymer layer 607 may be applied to protect the backside bumps 605 during debond processes. The polymer layer 607 may comprise a resist material or an adhesive film or tape, for example, that may be applied on the wafer 603 over the backside bumps 605.

A subsequent chuck attachment, such as with a vacuum technique, to the carrier wafer 601 and the top surface of the polymer layer 607 is shown in FIG. 6B. The top chuck 609A may be moved in one lateral direction while the bottom chuck 609B may be moved in the opposite direction to separate the carrier wafer 601 from the wafer 603. The polymer layer 607 may enable a proper vacuum seal to the surface, where there may be a poor seal when applied directly to the backside bumps 605.

FIG. 6C shows the resulting structure following debond from the carrier wafer 601. Any adhesive residue remaining from the carrier wafer 601 may be removed in a cleaning process while still attached to the top chuck 609A.

The cleaned structure may then be affixed to a film frame 611 with the backside bumps 605 facing up, as shown in FIG. 6D, for example. The polymer layer 607 may then be removed either chemically or thermally followed by a surface clean, resulting in the bonded wafer 603 shown in FIG. 6E, for example. The film frame 611 may enable further processing and ease of transport for the bonded wafer 603.

Figure 7:
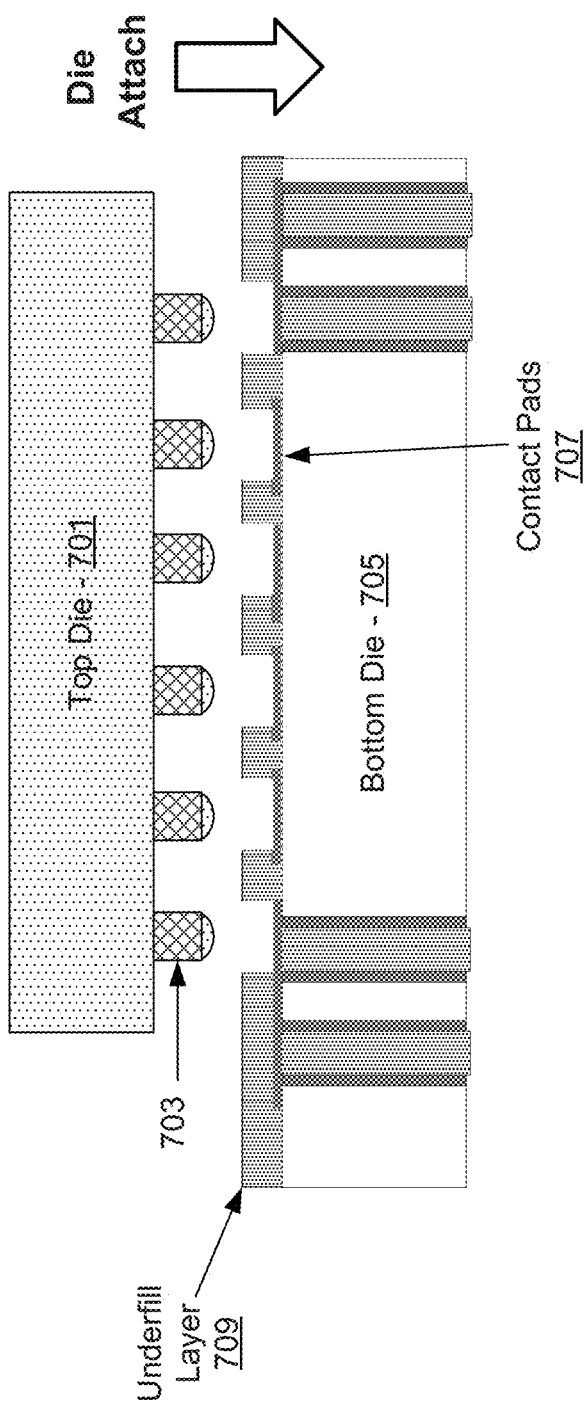
FIG. 7 is a diagram illustrating die bonding utilizing a patterned underfill layer, in accordance with an example embodiment of the invention.

FIG. 7 is a diagram illustrating die bonding utilizing a patterned underfill layer, in accordance with an example embodiment of the invention. Referring to FIG. 7, there is shown a top die 701 with microbumps 703 and a bottom die 705 comprising contact pads 707 and an underfill layer 709.

In an example scenario, the microbumps 703 may comprise copper pillars, for example, and may correspond to the contact pads 707 in the bottom die 705. Although the bottom die 705 is shown as a single die, in another example scenario, it may comprise an entire wafer of die, with a plurality of top die 701 being bonded to an interposer wafer 705 as opposed to a single die. The underfill layer 709 may comprise a polymer applied to the top surface of the bottom die 705 that the next level die, e.g., the top die 701, will be bonded to. The polymer may comprise a re-passivation or pre-applied underfill that will flow and bond to both die surfaces negating the need for subsequent underfill processes.

Furthermore, the underfill layer 709 may be patterned utilizing photolithography techniques or laser ablation to expose the appropriate contact pads 707 in the bottom die 705, for example by forming wells in the underfill layer 709. The layer 709 may comprise a film where the openings may comprise full depth pockets or partial depth pockets, for example, generated using laser ablation or photolithography techniques. Material remaining in the partial depth pockets may assist in the bonding process of the top die 701 to the bottom die 705, for example.

The exposed pads may be utilized to align the top die 701 to the bottom die 705. The die may be bonded utilizing a thermal compression or mass reflow technique, for example. A flux dip may be utilized to aid in wetting of solder from one surface to the other and the underfill may "snap-cure" and seal both to the top and bottom die surfaces. Furthermore the underfill may flow around and under the microbumps 703 and the contact pads 707 during the bond process.

In an embodiment of the invention, a method and system are disclosed for a semiconductor device package 100, 150 with a die to interposer wafer first bond. In this regard, aspects of the invention may comprise bonding a plurality of semiconductor die 101, 121, 203A-203C, 405, 505, 701 comprising electronic devices to an interposer wafer 127, 201, and in instances where wafer 603 comprises an interposer wafer, 603, and applying an underfill material 210, 217, 709 between the plurality of semiconductor die 101, 121, 203A-203C, 405, 505, 701 and the interposer wafer. A mold material 211, 303 may be applied to encapsulate the plurality of semiconductor die 101, 121, 203A-203C, 405, 505, 701.

The interposer wafer 127, 201, and in instances where wafer 603 comprises an interposer wafer, 603, may be thinned to expose through-silicon-vias (TSVs) and metal contacts 213, 707 may be applied to the exposed TSVs. The interposer wafer 127, 201, and in instances where wafer 603 comprises an interposer wafer, 603, may be singulated to generate a plurality of assemblies 100, 150 each comprising one or more of the plurality of semiconductor die 101, 121, 203A-203C, 405, 505, 701 and an interposer die 107, 201A, 407, 507, 705. The one or more of the plurality of assemblies may be bonded to one or more packaging substrates 103. The plurality of die 101, 121, 203A-203C, 405, 505, 701 may be placed on the interposer wafer 127, 201, and in instances where wafer 603 comprises an interposer wafer, 603, for the bonding utilizing an adhesive film 611.

The interposer wafer 127, 201, and in instances where wafer 603 comprises an interposer wafer, 603, may be singulated utilizing one or more of: a laser cutting process, reactive ion etching, a sawing technique, and a plasma etching process. The underfill material 210, 217, 709 may be applied utilizing a capillary underfill process. The plurality of semiconductor die 101, 121, 203A-203C, 405, 505, 701 may be bonded to the interposer wafer 127, 201, and in instances where wafer 603 comprises an interposer wafer, 603, utilizing a mass reflow process or a thermal compression process.

The one or more additional die 101, 121, 203A-203C, 405, 505, 701 may be bonded to the plurality of semiconductor die 101, 121, 203A-203C, 405, 505, 701 utilizing a mass reflow processor a thermal compression process. The mold material 211, 303 may comprise a polymer. The one or more additional die 101, 121, 203A-203C, 405, 505, 701 may comprise micro-bumps for coupling to the plurality of semiconductor die 101, 121, 203A-203C, 405, 505.

Certain aspects of the invention may be found in a method and system for a semiconductor device package with a die-to-packaging substrate first bond. Example aspects of the invention may comprise bonding a first semiconductor die to a packaging substrate, applying an underfill material between the first semiconductor die and the packaging substrate, and bonding one or more additional die to the first semiconductor die. The one or more additional die may comprise electronic devices. The first semiconductor die may comprise an interposer die, or the first semiconductor die may comprise electronic devices. The first semiconductor die may be bonded to the packaging substrate utilizing a mass reflow process or a thermal compression process. The one or more additional die may be bonded to the first die utilizing a mass reflow process or a thermal compression process. The bonded first die and the bonded one or more additional die may be encapsulated in a mold material. The mold material may comprise a polymer. The one or more additional die may comprise micro-bumps for coupling to the first semiconductor die.

Figure 8A:
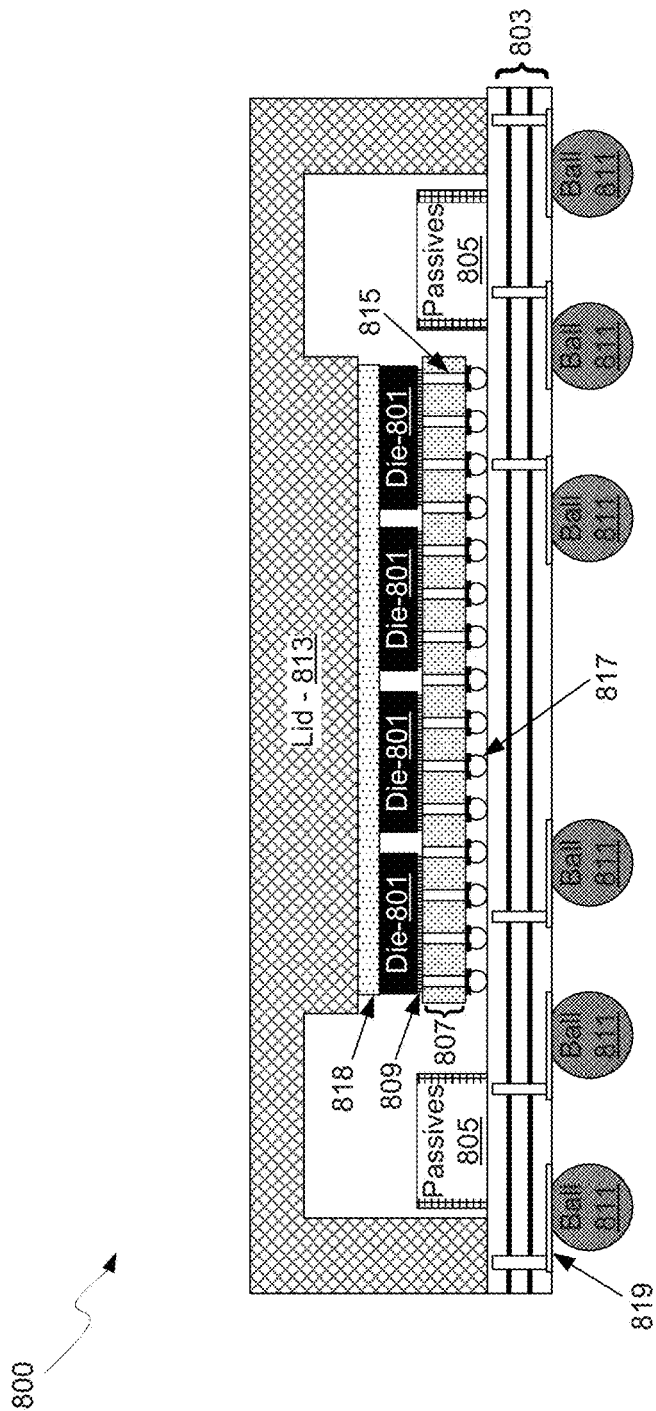
FIG. 8A is a schematic illustrating an integrated circuit package configured with an interposer-to-packaging substrate first bond, in accordance with an example embodiment of the invention.

FIG. 8A is a schematic illustrating an integrated circuit package configured with an interposer-to-packaging substrate first bond, in accordance with an example embodiment of the invention. Referring to FIG. 8A, there is shown a package 800 comprising die 801, a packaging substrate 803, passive devices 805, an interposer 807, solder balls 811, a lid 813, and thermal interface material 818.

The die 801 may comprise integrated circuit die that have been separated from one or more semiconductor wafers. The die 801 may comprise electrical circuitry such as digital signal processors (DSPs), network processors, power management units, audio processors, RF circuitry, wireless baseband system-on-chip (SoC) processors, sensors, and application specific integrated circuits, for example. In addition, the die 801 may comprise micro-bumps 809 for providing electrical contact between the circuitry in the die 801 and contact pads on the surface of the interposer 807.

The interposer 807 may comprise a semiconductor die, such as a silicon die, with through-silicon-vias (TSVs) 815 that provide electrically conductive paths from one surface of the interposer 807 to the opposite surface. The interposer 807 may also comprise backside bumps 817 for making electrical and mechanical contact to the packaging substrate 803. In another example scenario, the interposer 807 may comprise glass or an organic laminate material, either of which may be capable of large panel formats on the order of 500×500 mm, for example.

The packaging substrate 803 may comprise a mechanical support structure for the interposer 807, the die 801, the passive devices 805, and the lid 813. The packaging substrate 803 may comprise solder balls 811 on the bottom surface for providing electrical contact to external devices and circuits, for example. The packaging substrate 803 may also comprise conductive traces in a non-conductive material for providing conductive paths from the solder balls to the die 801 via pads that are configured to receive the backside bumps 817 on the interposer 807. Additionally, the packaging substrate 803 may comprise pads 819 for receiving the solder balls 811. The pads 819 may comprise one or more under-bump metals, for example, for providing a proper electrical and mechanical contact between the packaging substrate 803 and the solder balls 811.

The passive devices 805 may comprise electrical devices such as resistors, capacitors, and inductors, for example, which may provide functionality to devices and circuits in the die 801. The passive devices 805 may comprise devices that are difficult to integrate in the integrated circuits in the die 801, such as high value capacitors or inductors. In another example scenario, the passive devices 805 may comprise one or more crystal oscillators for providing one or more clock signals to the die 801.

The lid 813 may provide a hermetic seal for the devices within the cavity defined by the lid 810 and the packaging substrate 803. A thermal interface may be created for heat transfer out of the die 801 to the lid 813 via the thermal interface material 818, which may also act as an adhesive.

In an example scenario, the package 800 may be fabricated by first bonding the interposer 807 to the packaging substrate 803 utilizing a mass reflow or thermal compression process. The die 801 may subsequently be bonded to the interposer 807 utilizing either mass reflow or thermal compression. A capillary underfill process may follow the bonding process for mechanical and insulating purposes. Electrical tests may be performed following the bonding processes to verify that proper electrical connections were made and no shorts or open circuits exist.

Figure 8B:
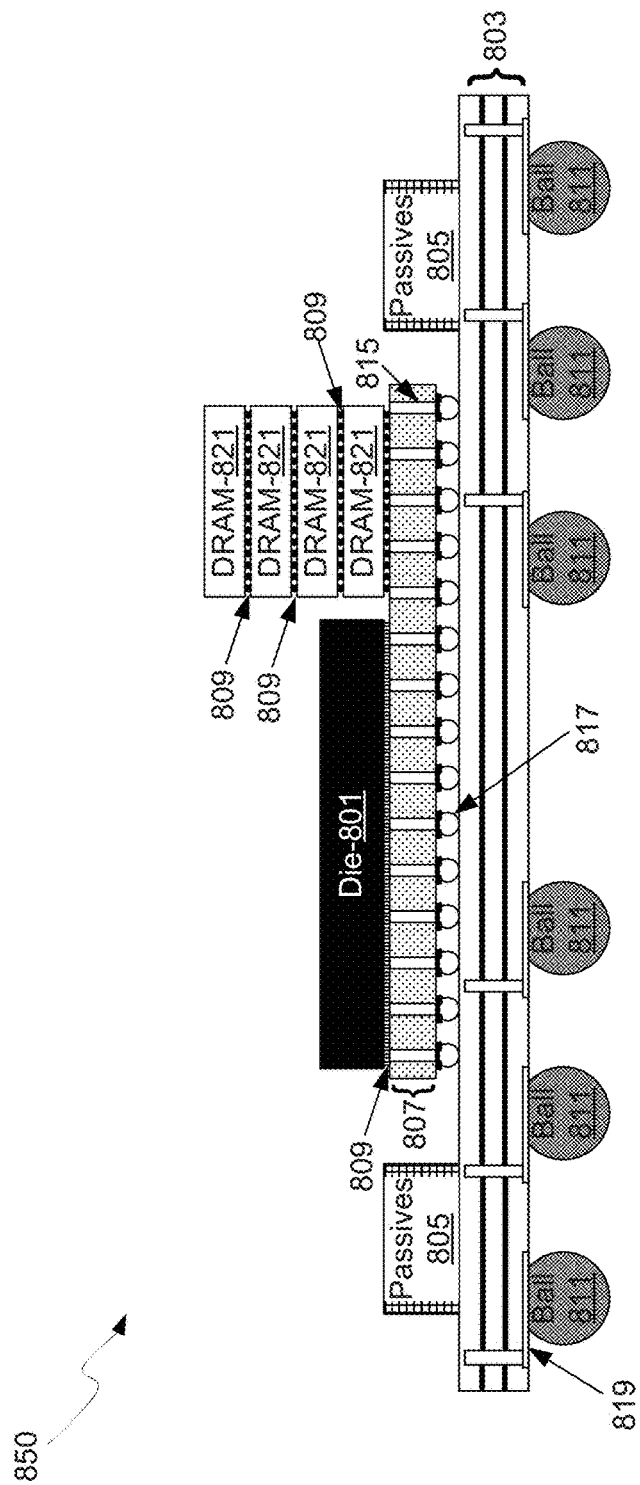
FIG. 8B is a schematic illustrating an integrated circuit package configured with an interposer-to-packaging substrate first bond and stacked die, in accordance with an example embodiment of the invention.

FIG. 8B is a schematic illustrating an integrated circuit package configured with an interposer-to-packaging substrate first bond and stacked die, in accordance with an example embodiment of the invention. Referring to FIG. 8B, there is shown a package 850 comprising the die 801, the packaging substrate 803, the passive devices 805, the interposer 807, and a stack of dynamic random access memory (DRAM) 821. The die 801, the packaging substrate 803, the passive devices 805, and the interposer 807 may be substantially as described with respect to FIG. 8A, for example, but with different electrical connectivity for the different die 801 and the stack of DRAM 821.

The DRAM 821 may comprise a stack of die for providing a high density memory for circuitry in the die 801 or external to the package 850. The DRAM 821 may be stacked front-to-back and therefore comprise TSV's for providing electrical connectivity between the individual die.

In an example scenario, the package 850 may be fabricated by first bonding the interposer 807 to the packaging substrate 803 utilizing a mass reflow or thermal compression process. The die 801 may subsequently be bonded to the interposer 807 utilizing either mass reflow or thermal compression. In addition, the stack of DRAM 821 may then be bonded to the interposer 807. A capillary underfill process may follow the bonding process for mechanical and insulating purposes. Electrical tests may be performed following the bonding processes to verify that proper electrical connections were made and no shorts or open circuits exist.

FIGS. 8C-8E illustrate steps for bonding multiple die utilizing an adhesive film, in accordance with an example embodiment of the invention. Referring to FIG. 8C, there is shown a plurality of die 822 and an adhesive layer 829. Each of the plurality of die 822 may comprise a metal interconnect 823 for subsequent bonding to other die. In another example scenario, the metal interconnects 823 may comprise microbumps or copper pillars, for example.

The adhesive film 829 may comprise an adhesive tape or compliant layer, for example, to which the plurality of die 822 may be bonded, as illustrated in FIG. 8C. The adhesive film 829 may be a temporary adhesive for attaching multiple die to another die. In an example scenario, the plurality of die 822 may be placed temporarily on the adhesive film 829. While FIG. 8C illustrates the plurality of die 822 as consisting of three die, more or less die (including a single die) are also possible and contemplated.

An optional underfill material 825 may also be placed on a die 827 as shown in FIG. 8D, once the plurality of die 822 have been attached to the adhesive film 829. The underfill material 825 may be for subsequent thermal compression bonding processes, for example, and may allow instant underfill through a snap cure during a subsequent thermal compression bonding process. This may improve bonding yields since a single underfill process may be utilized for the plurality of die 822 as compared to a separate place and underfill process for each of the plurality of die 822. The plurality of die 822 may be placed face up so that the metal interconnects 823 may be coupled to a receiving die.

The plurality of die 822 on the adhesive film 829 may then be placed on the die 827 (or other substrate, for example, a packaging substrate), as shown in FIGS. 8D and 8E, for example, where the initial placement of the plurality of die 822 on the adhesive film 829 may enable fine control of the spacing and alignment of the plurality of die 822 with the die 827. In an example scenario, the die 827 may be gang bonded to the individual die 822. The die 827 may comprise metal pads 831 for receiving the metal interconnects 823. Once the plurality of die 822 are placed on the die 827, a thermal compression bond process may be performed for proper electrical and mechanical bonds between the metal interconnects 823 and the metal pads 831. Once bonded, the adhesive film 829 may be removed resulting in the structure shown in FIG. 8E.

Figure 9:
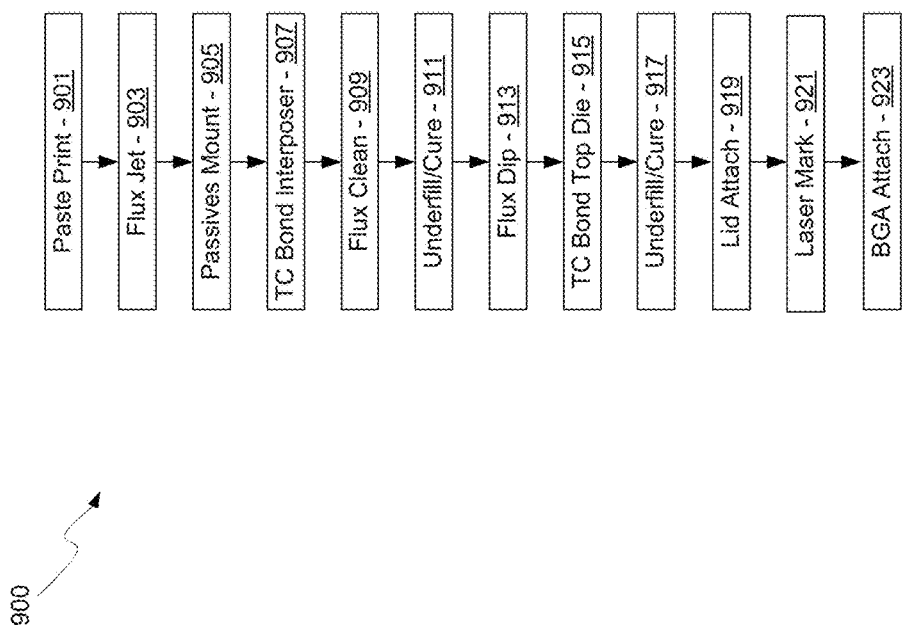
FIG. 9 is a schematic illustrating a die to packaging substrate process flow, in accordance with an example embodiment of the invention.

FIG. 9 is a schematic illustrating a die to packaging substrate process flow, in accordance with an example embodiment of the invention. Referring to FIG. 9, there is shown die to packaging process 900 that comprises a paste print step 901, a flux jet step 903, a passives mount step 905, and thermal compression bond interposer step 907. The packaging process 900 may also comprise a flux clean step 909 an underfill and cure step 911, a flux dip step 913, and a thermal compression top die bond step 915. These steps may be followed by an underfill and cure step 917, a lid attach step 919, a laser mark step 921, and a ball grid array (BGA) attach step 923.

The paste print step 901 may comprise the application of non-conductive paste to assist in the subsequent thermal compression bonding of die to the packaging substrate. The die to be bonded may comprise an interposer die or a functional die, which may comprise digital signal processors (DSPs), network processors, power management units, audio processors, RF circuitry, wireless baseband system-on-chip (SoC) processors, sensors, and application specific integrated circuits, for example.

The flux jet step 903 may comprise the preparation of the conductive surfaces on the packaging substrate for subsequent conductive bonding. The flux process may comprise a surface cleaning step and may remove excessive oxide layers on the surfaces to be bonded. For example, the pads on the packaging substrate may be fluxed for subsequent bonding with backside bumps on the interposer die or for microbumps on a functional die. Additionally, bond pads on the packaging substrate may be prepared for the subsequent mounting of passive devices.

Figure 10:
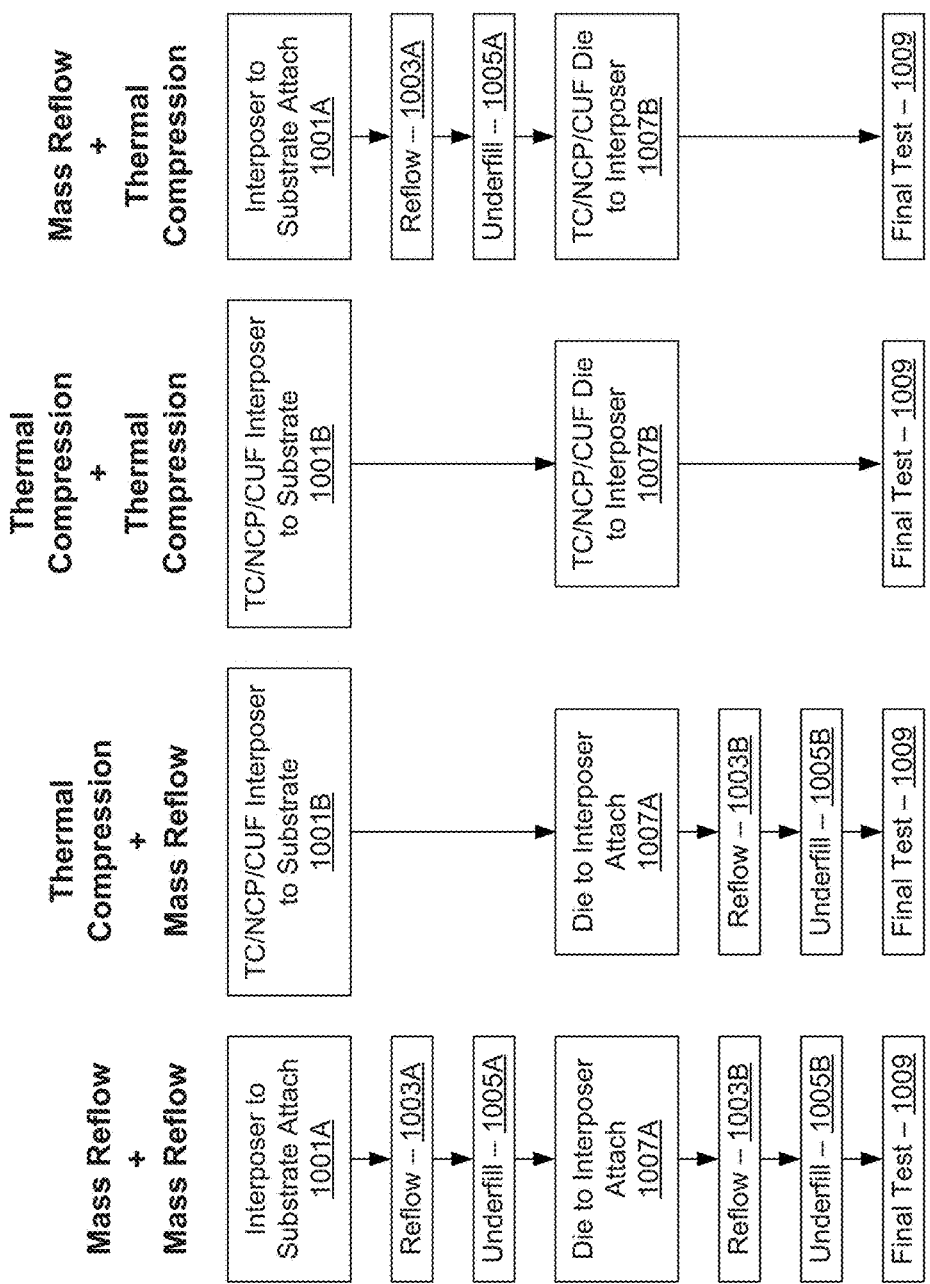
FIG. 10 is a schematic illustrating bonding options for die in a package, in accordance with an example embodiment of the invention.
Figure 14:
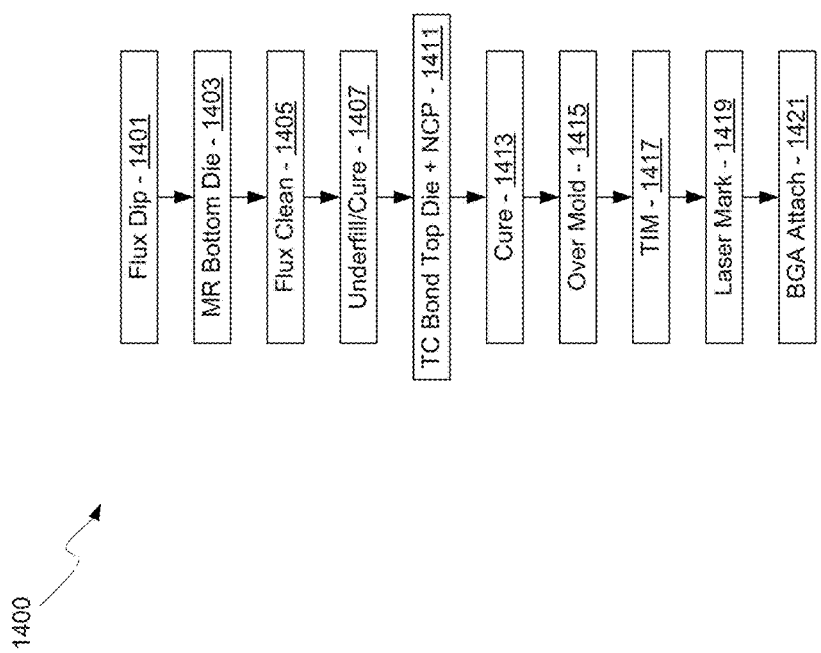
FIG. 14 is a flow diagram illustrating a stacked die to packaging substrate fabrication process, in accordance with an example embodiment of the invention.

In the passives mount step 905, passive devices, such as the passive devices 805 described with respect to FIGS. 8A and 8B, may be mounted to the packaging substrate. In the thermal compression bond Interposer step 907, an interposer die may be bonded to the packaging substrate utilizing a thermal compression bonding process. The previously applied non-conductive paste may be physically displaced by the compression of conductive surfaces. While a thermal compression bonding process is shown in FIG. 9, a mass reflow process may also be used for bonding the interposer or functional die to the packaging substrate. Examples of this process are shown in FIGS. 10 and 14.

In the flux clean step 909, residual flux may be removed in a solvent and/or deionized (DI) water rinse, for example, followed by a drying process at an elevated temperature. This may prepare the bonded structure for a capillary underflow process in the underfill/cure step 911. In this process, an underflow material may be injected at the edges of the bonded die and capillary action at an elevated temperature may distribute the material uniformly under the bonded die, providing a protective dielectric layer around the electrical bonds. Once the capillary action has distributed the underfill material, it may be cured at an elevated temperature for an extended time.

Following the capillary underfill and cure process, the flux dip step 813 may be performed, which may flux the bond regions on the bonded interposer or functional die for subsequent bonding to microbumps on other die. The flux material may provide a cleaning mechanism for the bonding surfaces and may remove excess oxide layers from the metal.

A top die may then be bonded to the structure in a thermal compression top die step 915. The top die may be bonded to the previously bonded interposer die or a previously bonded functional die. The top die may be pressed against the interposer die/packaging substrate at an elevated temperature to provide an electrical and mechanical support formed by the bonded contacts. As with the thermal compression bond interposer step 907, the thermal compression bond top die step 915 may instead comprise a mass reflow bonding process, as illustrated in FIG. 10, for example.

Another underfill and cure process may be performed, but for the top die, in the underfill/cure step 917, which may comprise the injection of an underfill material that may redistribute under the top die via capillary action at an elevated temperature. Similarly, the underfill material may then be cured at an elevated temperature for an extended time, up to a few hours, for example.

The process may continue with the lid attach step 919, which may place a protective and hermetic seal, if desired, over the bonded die, interposer, and packaging substrate, similar to the lid 813 shown in FIG. 8A for example. This may be followed by a laser mark step 921 where identifying marks may be made in the lid and/or packaging substrate. Finally, a ball grid array (BGA) attach step 923 may be performed to mount solder balls, e.g. solder balls 811, to the packaging substrate for subsequent bonding to a circuit board or other support structure. The BGA may be subjected to a reflow process to ensure good electrical and mechanical contact to the pads on the packaging substrate.

FIG. 10 is a schematic illustrating bonding options for die in a package, in accordance with an embodiment of the invention. Referring to FIG. 10, there are shown four process variations comprising mass reflow and thermal compression bonding steps. Each process illustrates a first die bonding process, which may comprise an interposer die to a packaging substrate, and a second bond comprising a die to the previously bonded interposer die.

The first process comprises a mass reflow/mass reflow process, with the first step being an interposer die to substrate attach step 1001A, followed by a reflow step 1003A, and underfill step 1005A, a die to interposer attach step 1007A, a second reflow step 1003B, a second underfill step 1005B, and a final test step 1009.

In this example scenario, the interposer die to substrate attach step 1001A and the die to interposer attach step 1007A may comprise mass reflow bonding processes (e.g., at steps 1003A and 1003B, respectively).

The second process flow comprises a thermal compression first bond and a mass reflow second bond. The process thus comprises a thermal compression/non-conductive paste/capillary underfill interposer die to substrate bonding step 1001B, a die to interposer attach step 1007A, followed by the reflow step 1003B, the underfill step 1005B, and the final test step 1009.

The third process flow comprises two thermal compression bonding processes, so that the process comprises the thermal compression/non-conductive paste/capillary underfill interposer die to substrate bonding step 1001B, a thermal compression/non-conductive paste/capillary underfill die to interposer bonding step 1007B, and the final test step 1009.

Finally, the fourth process flow comprises a mass reflow first bond and a thermal compression second bond, so that the process comprises the interposer die to substrate attach step 1001A, the reflow step 1003A, the underfill step 1005A, the thermal compression/non-conductive paste/capillary underfill die to interposer bonding step 1007B, and the final test step 1009.

The process flows shown in FIG. 10 illustrate that any combination of mass reflow and thermal compression may be utilized to bond the various die in the package. Thermal compression bonding techniques may be advantageous at 40 micron pitch or less and white bumps, i.e. high-k dielectric layer delamination, may be eliminated with thermal compression bonding. In addition, flatness may be improved with thermal compression bonding, resulting in fewer open circuit connections due to excessive gaps.

Figure 11C:
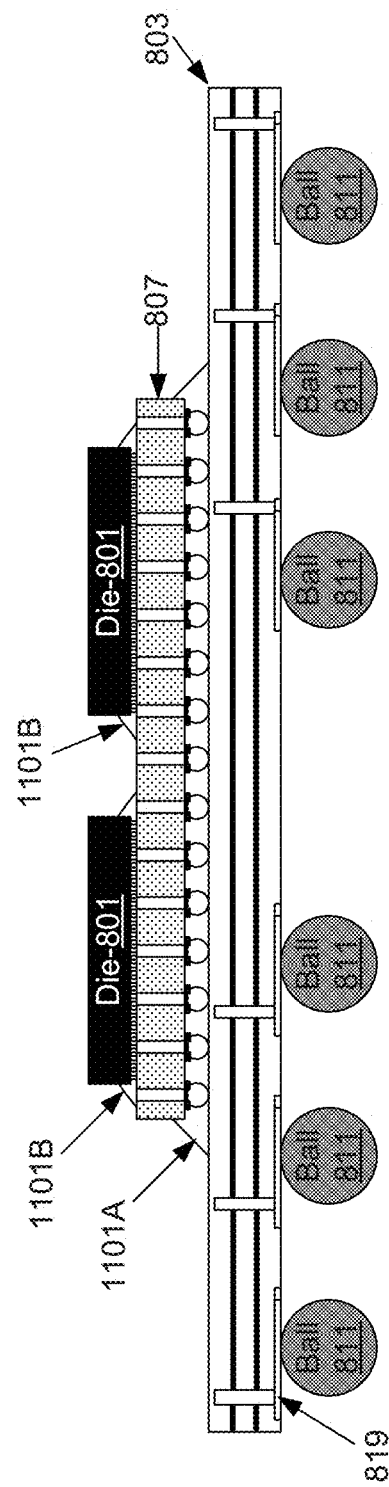

FIGS. 11A-11C illustrate a process for an interposer-to-packaging substrate first bond, in accordance with an example embodiment of the invention. Referring to FIG. 11A, there is shown the packaging substrate 803 and the interposer 807. The packaging substrate 803 and the interposer 807 may be as described previously, for example, where the packaging substrate 803 may comprise the pads 819 and the interposer 807 may comprise the TSVs 815 and the backside bumps 817.

The interposer die 807 may be bonded to the packaging substrate 803 utilizing a mass reflow process or a thermal compression with non-conductive paste process. The mass reflow process may comprise a flux dip to prepare the metal surfaces for proper bonding. The thermal compression bonding process may comprise the selective application of non-conductive paste or film to assist in the bonding process. In addition, a capillary underfill process may fill the void between the backside bumps 817 in the region between the interposer 807 and the packaging substrate 803, as illustrated by the underfill 1011A for example.

In FIG. 11B, the die 801 may be bonded to the interposer die 807 utilizing a mass reflow process or a thermal compression with non-conductive paste process. As with the interposer die 807, a capillary underfill process may fill the void between the microbumps 809 in the region between the die 801 and the interposer die 807, as illustrated by the underfill 1101B shown in FIG. 11C for example.

While the coupling of two die 801 to the interposer die 807 is illustrated in FIGS. 11A-11C, the invention is not necessarily so limited. Accordingly, any number of die may be bonded to the interposer 807 determined by available space and power and thermal requirements, for example. Furthermore, die may be stacked on the interposer die 807, as illustrated in FIG. 8B for example.

Finally, the solder balls 811 may be placed on the pads 819 on the packaging substrate 803. A flux process may be utilized to prepare the solder balls 811 and the pads 819. The solder balls 811 may be subjected to a reflow process following placement to make low resistance and mechanically sound contacts to the pads 819.

Figure 12:
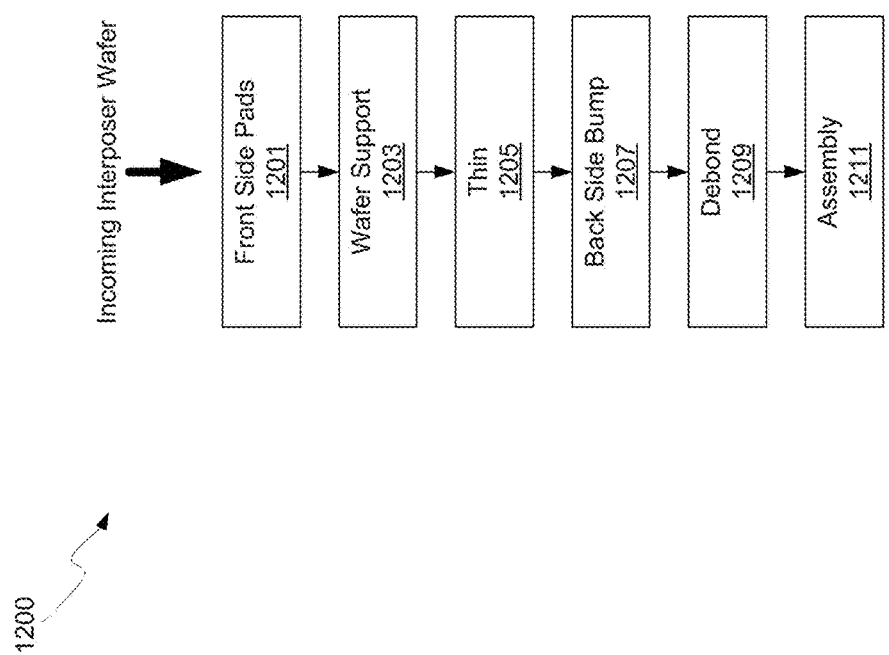
FIG. 12 is a flow diagram illustrating an interposer fabrication process, in accordance with an example embodiment of the invention.

FIG. 12 is a flow diagram illustrating an interposer fabrication process, in accordance with an example embodiment of the invention. Referring to FIG. 12, an incoming interposer wafer may proceed to the front side pads step 1201 where contact pads may be deposited on the front side of the interposer wafer. In an example scenario, the front side pads may comprise nickel/palladium/gold.

The interposer wafer may then proceed to the wafer support step 1203, where the wafer may be bonded to a support substrate with an adhesive layer, for example. In an example scenario, the support structure may comprise a rigid substrate, such as a silicon substrate, for example, with an adhesive layer for affixing the interposer wafer. The front surface with contact pads may be affixed to the wafer support to allow processing of the back surface. This support may allow subsequent processing steps, such as thinning of the interposer, without causing catastrophic physical damage.

In the thin step 1205, the interposer wafer may be thinned down to a thickness that exposes the TSVs in the substrate. The thinning may comprise a chemical-mechanical polish (CMP) process for removing material at the back surface of the interposer.

The thinning step 1205 may be followed by the back side bump step 1207, where metal bumps may be attached at the exposed TSVs to enable electrical contact to the back surface. The back side bumps may be utilized to bond the interposer to a packaging substrate, for example. The back side bumps may be subjected to a reflow process to ensure proper electrical and mechanical bonds to the interposer.

After the back bumps have been applied, the interposer may be removed from the wafer support in the debond step

1209. This may comprise a thermal ramp for removing the adhesive layer and/or may comprise a solvent step for removing the adhesive. Finally, the interposer may proceed to the assembly step 1211, where the interposer may be singulated and integrated into a package as shown in FIGS. 8A-11C, for example.

FIGS. 13A and 13B illustrate initial steps in an interposer fabrication process, in accordance with an example embodiment of the invention. Referring to FIG. 13A, there is shown an interposer 1310 (e.g., an interposer wafer) and a support structure 1303. The support structure 1303 may comprise a multi-layer structure. In an example scenario, the support structure 1303 may comprise a rigid substrate, such as a silicon substrate, for example, with an adhesive layer for affixing the interposer 1310 to the support structure 1303.

The interposer 1310 may comprise a thick substrate prior to thinning, with front side pads 1301 that may be utilized as contact pads for semiconductor die that will be coupled to the interposer 1310 following processing. The interposer 1310 at this stage may be thicker than the thickness of the interposer 807 as integrated in FIGS. 8A-11C for ease of handling and processing, such as the deposition of the front side pads 1301. The interposer 1310 may comprise TSVs 815 that extend partially through the thick substrate, where the TSVs 815 will be exposed after subsequent thinning of the interposer wafer 1310. The interposer 1310 may also comprise a metal interconnect layer 1305 for coupling the TSVs 815 to appropriate front side pads 1301.

FIG. 13B illustrates the support structure 1303 affixed to the interposer wafer 1310 and the subsequent direction of thinning. The interposer 1310 may be thinned utilizing a CMP process, for example, and may be thinned to expose the TSVs 815.

Figure 13C:
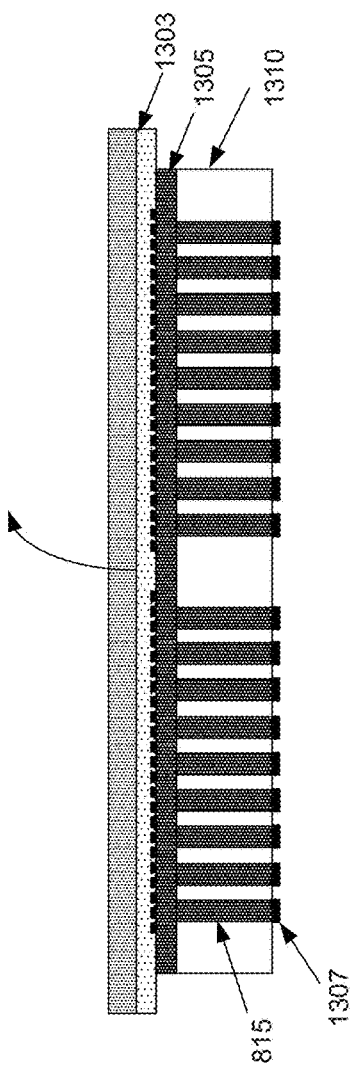
FIGS. 13C-13D illustrate final steps in an interposer fabrication process, in accordance with an example embodiment of the invention.
Figure 13D:
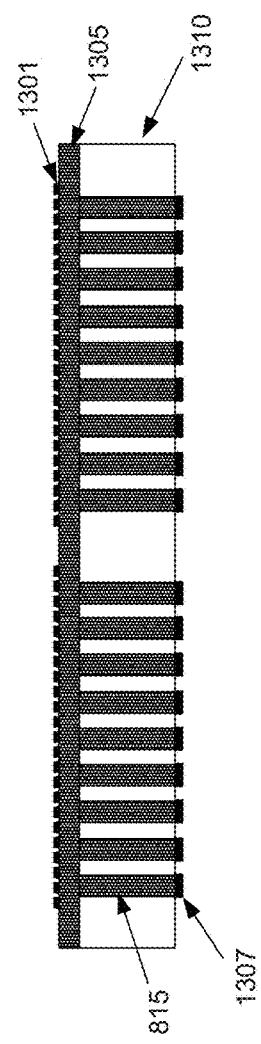

FIGS. 13C-13D illustrate the final steps in an interposer fabrication process, in accordance with an example embodiment of the invention. Referring to FIG. 13C, there is shown the thinned interposer 1310 with the affixed support structure 1303. With the TSVs 815 exposed, metal bumps may be attached at the exposed TSV 815 surfaces, resulting in the back side bumps 1307, which may be utilized to couple the interposer 1310 to a packaging substrate.

After the back side bumps 1307 are attached, the support structure 1303 may be removed through a heating process, or a solvent process, for example. The resulting structure may comprise an interposer 1310 that may subsequently be diced into individual interposers comprising die, such as the interposer 807.

FIG. 14 is a flow diagram illustrating a stacked die to packaging substrate fabrication process, in accordance with an example embodiment of the invention. Referring to FIG. 14, in step flux dip step 1401, a packaging substrate may be placed in a flux dip to prepare metal contact surfaces for bonding with metal bumps, such as C4 micro bumps, on a semiconductor die (e.g., an electronics or functional die, an interposer die, etc.).

In mass reflow bottom die step 1403, a first die may be bonded to the packaging substrate utilizing a mass reflow process. While a mass reflow process is shown for attaching the bottom die, the invention is not necessarily so limited. Accordingly, other bonding techniques may be utilized, such as a thermal compression process.

In flux clean step 1405, a cleaning process may be performed on the bonded die and packaging substrate to remove any remaining flux, followed by an underfill/cure step 1407, where an underfill material may be placed in the space between the bonded die and the packaging substrate. The underfill material may fill the volume under a capillary action, for example. Once the material is injected into the volume, it may be cured at an elevated temperature for hardening.

Once the underfill material is cured, one or more top die may be bonded to the bottom die in the thermal compression top die and non-conductive paste step 1411. In this step, a non-conductive paste may be placed on the top surface of the bottom die for subsequent bonding of one or more top die. An example structure may comprise a logic die as the bottom die and one or more memory die as the top die.

In the cure step 1413, the non-conductive paste may be cured at an elevated temperature, ensuring a sound mechanical bonding of the top die to the bottom die. This may be followed by the over mold step 1415, where a mold material may be placed over the bonded structure to result in a molded package. The mold material may provide encapsulation of the die and substrate package, for example, and may protect the circuitry from external stressors.

In the thermal interface material step 1417, a material with good thermal conductivity may be placed on the exposed top surface of the top die. This may enable heat sinking for the bonded die with a thermally conductive layer conducting heat away from the bonded die to a subsequently attached heat sink. In instances where the mold material remains on the top surface of the top die after the over mold step 1415, the mold material may be removed in a grind step.

This may be followed by a laser mark step 1419 where identifying marks may be placed on the molded package, followed by ball grid array (BGA) attach step 1421, where conductive balls may be attached to the bottom surface of the packaging substrate. The BGA may subsequently be utilized to attach the entire package to a circuit board, for example.

Figure 15A:
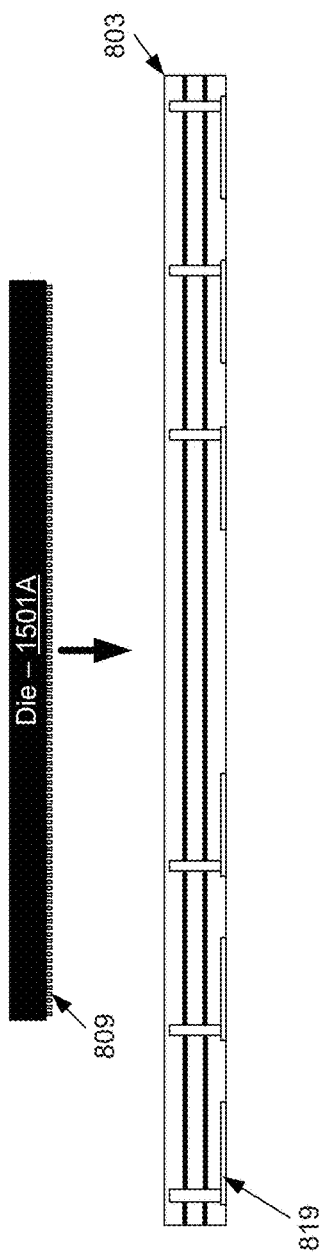
FIGS. 15A-15B illustrate initial steps in a functional die to package substrate assembly process, in accordance with an example embodiment of the invention.
Figure 15B:
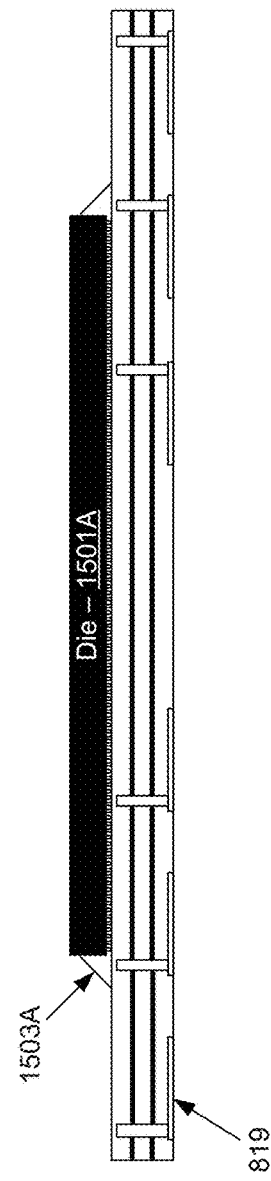

FIGS. 15A and 15B illustrate initial steps in a functional die to package substrate assembly process, in accordance with an example embodiment of the invention. Referring to FIG. 15A, there is shown a die 1501A and the packaging substrate 803. The packaging substrate 803 may be as described previously, for example, and may comprise back side pads 819 for subsequent bonding of solder balls.

The die 1501A may comprise electrical circuitry such as digital signal processors (DSPs), network processors, power management units, audio processors, RF circuitry, wireless baseband system-on-chip (SoC) processors, sensors, and application specific integrated circuits, for example. Furthermore, the die 1501A may comprise the micro-bumps 809 for making electrical contact to the packaging substrate 803. The die 1501A may be bonded to the packaging substrate utilizing a mass reflow process or a thermal compression and non-conductive paste bonding process.

Following the bonding process, a capillary underfill process may be performed to fill the volume between the die 1501A and the packaging substrate 803 with a subsequent curing process. When deposited or placed, the underfill material 1503A may comprise a film, paste, b-stage film, or a liquid, for example. The resulting structure is illustrated in FIG. 15B.

Figure 15C:
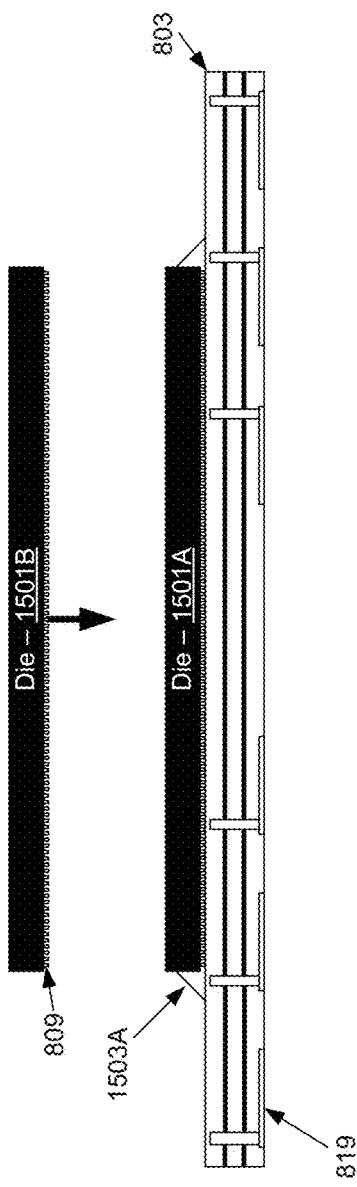
FIGS. 15C-15D illustrate final steps in a functional die to package substrate assembly process, in accordance with an example embodiment of the invention.
Figure 15D:
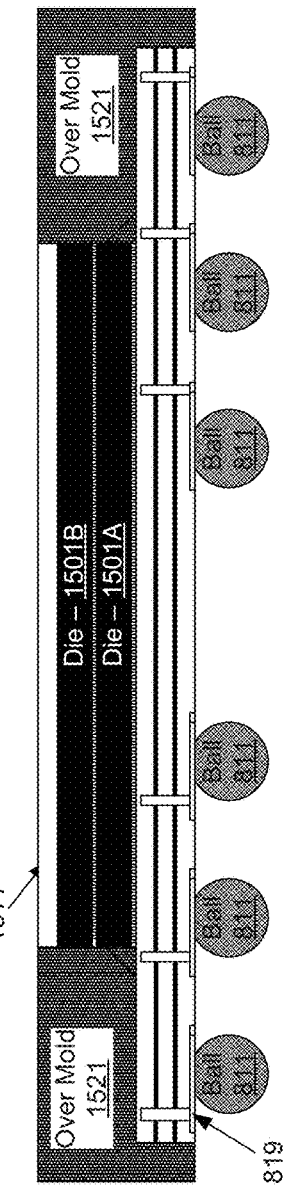

FIGS. 15C and 15D illustrate final steps in a functional die to package substrate assembly process, in accordance with an example embodiment of the invention. Referring to FIG. 15C, the die 1501B may be bonded to the die 1501A previously bonded to the packaging substrate 803. The die 1501B may be coupled to the die 1501A via a thermal compression and non-conductive paste process. Micro-bumps 809 on the die 1501B may be coupled to pads on the die 1501A. In another example scenario, the die 1501B may be coupled to the die 1501A utilizing a mass reflow process.

An over mold process may be utilized to encapsulate the bonded structure, resulting in the over mold 1521. The over mold 1521 may comprise a polymer that is placed on and around the die 1501A and 1501B and the packaging substrate 803 via a compression molding process. In an example scenario, the over mold may be placed around the die 1501A and 1501B, but not on top so that the thermal interface material 1511 may be deposited on top of the die 1501B. In another example scenario, the over mold process may result in over mold remaining on the top surface of the die 1501B but then removed, such as through a grinding or CMP process.

Figure 15E:
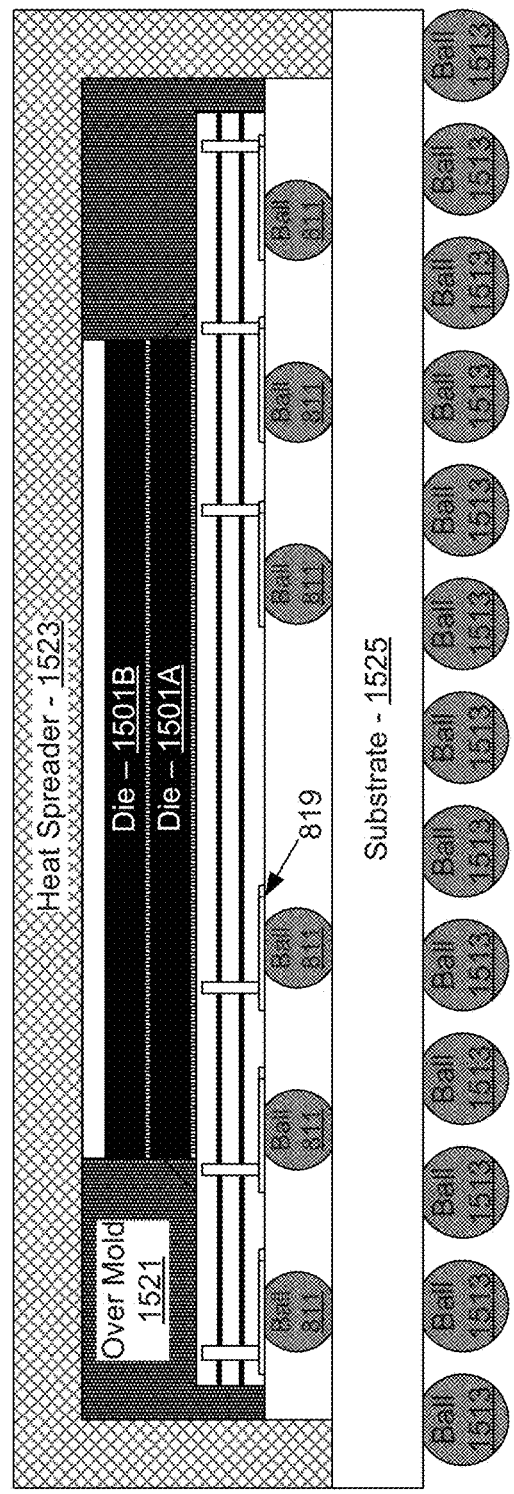
FIG. 15E illustrates the resulting assembly in the die to package substrate process, in accordance with an example embodiment of the invention.

While the underfill material 1503A is shown in FIGS. 15C to 15E, the over mold material itself may be utilized as underfill material for each coupling interface, such as between the interposer 803 and the die 1501A and between the die 1501A and 1501B. In another example embodiment, underfill material may be inserted as a liquid or paste, placed as a film, or a b-staged film and may be placed sequentially as each die to substrate or die to die bond is made, or may be made all at one time after all the electrical bonds are made.

The thermal interface material 1511 may be utilized to provide a thermal conductive path for heat out of the die 1501A and 1501B. A heat spreader 1523 may be placed above the thermal interface material 1511 to enable the heat transfer away from the circuitry in the die 1501A and 1501B, as illustrated in FIG. 15E.

Furthermore, the solder balls 811 may be bonded to the back side pads 819 on the packaging substrate 803. The solder balls 811 may be operable to provide electrical interconnects to external devices and circuitry, such as to a printed circuit board, for example. It is noted that while solder balls are shown in FIG. 15D, any metal interconnect may be utilized such as microbumps or copper pillars, for example.

FIG. 15E illustrates the resulting assembly in the die to package substrate process, in accordance with an example embodiment of the invention. As shown in FIG. 15E, a substrate 1525 may be bonded to the packaging substrate 803 utilizing the solder balls 811 and the heat spreader 1523 may be placed over the die 1501B in contact with the thermal interface material 1511 and the over mold 1521. In addition, a thermal interface material may be placed at the contact surface between the heat spreader 1523 and the substrate 1525.

Figure 16:
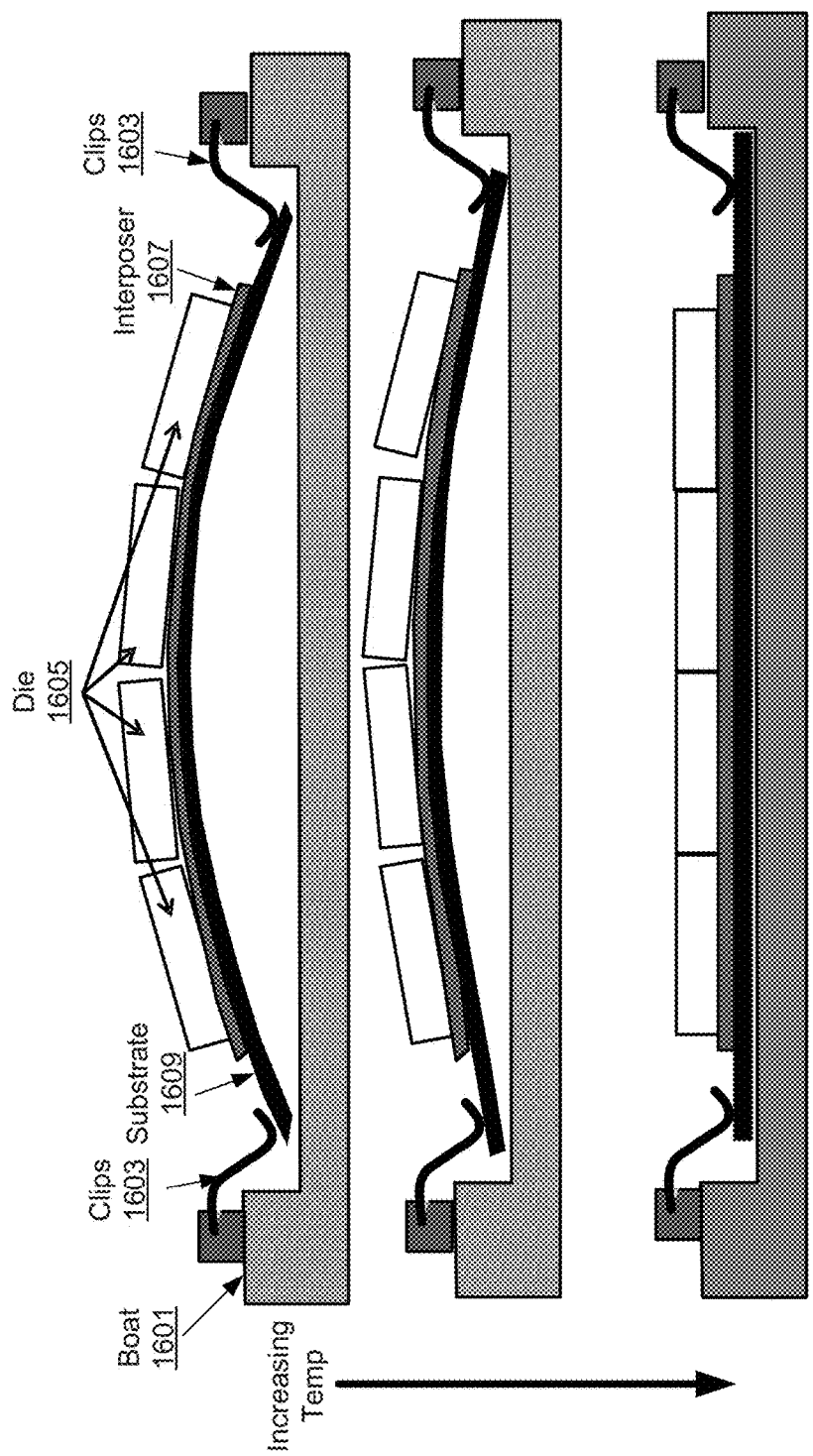
FIG. 16 is a diagram illustrating a mechanical planarizing apparatus, in accordance with an example embodiment of the invention.

FIG. 16 is a diagram illustrating a mechanical planarizing apparatus, in accordance with an example embodiment of the invention. Referring to FIG. 16, there is shown a boat 1601, clips 1603, a plurality of die 1605, an interposer 1607, and a substrate 1609. The boat 1601 may comprise a rigid support structure in which a die/interposer assembly may be placed and held in place by the clips 1603. The boat 1601 may be capable of withstanding high temperatures, above 200 C, for example.

The interposer 1607 may be bonded to the substrate 1609 utilizing a thermal compression technique, for example. Similarly, the plurality of die 1605 may be bonded to the interposer 1607 via a thermal compression bonding, technique, for example, prior to being placed in the boat 1601. As the temperature of the boat 1601, the plurality of die 1605 and the interposer 1607 increases, the curvature of an assembly comprising the plurality of die 1605 and interposer 1607 may flatten with the clips 1603 providing a downward force at the outer edges of the assembly. As the curvature approaches zero, the increased length in the lateral direction may be accommodated by sliding under the clips 1603. In addition, the boat 1601 may provide mechanical support in conjunction with the downward force of the clips 1603, thereby planarizing the assembly.

The boat 1601 and clips 1603 may permit the partially assembled package to heat up in normal fashion, but when that system has become flat, it resists the normal progression of the warpage, holding the partially assembled package to flatten during heating and then maintain that flatness of the silicon interposer as temperatures climb higher.

Figure 17:
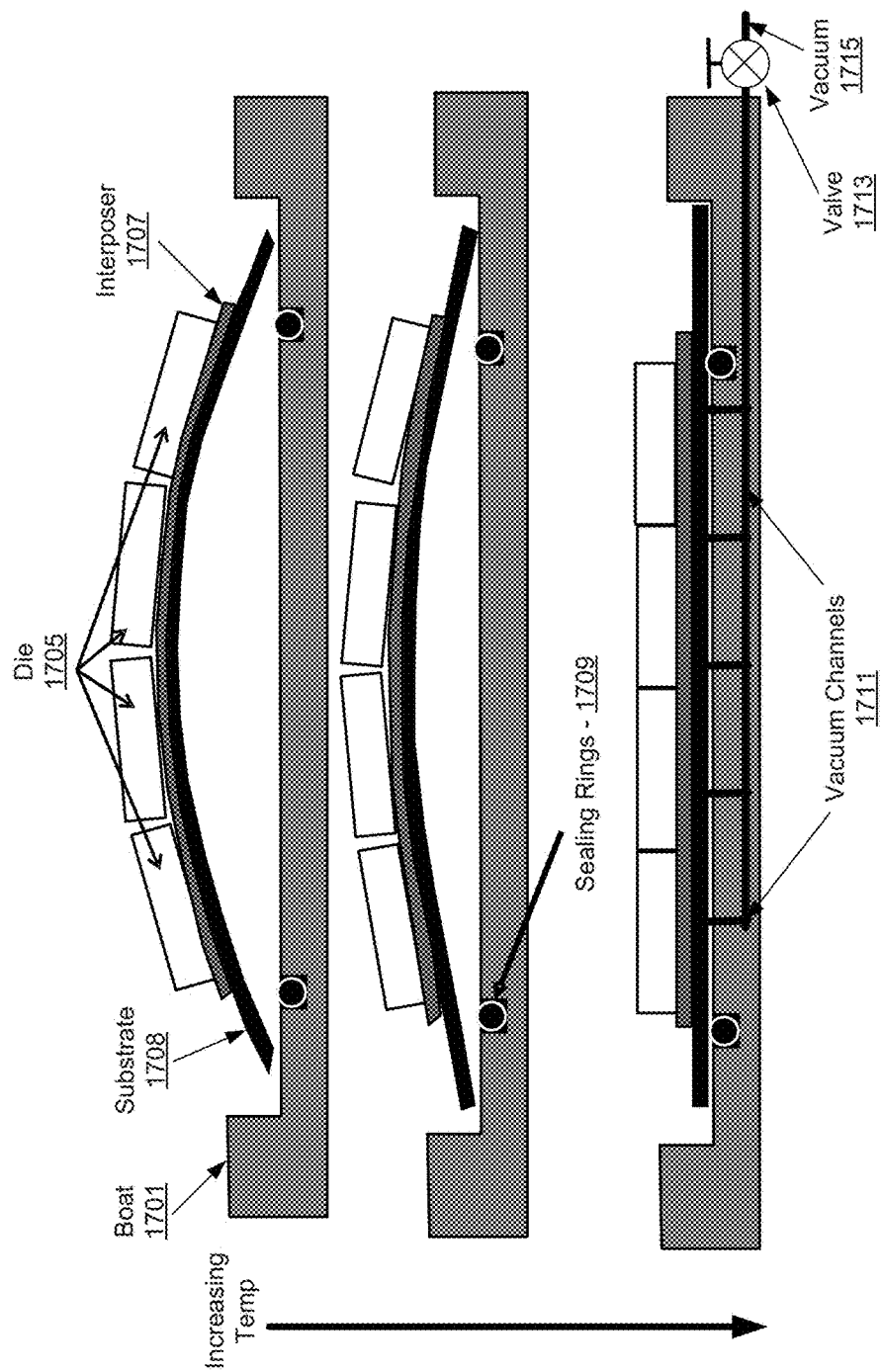
FIG. 17 is a diagram illustrating a vacuum planarizing apparatus, in accordance with an example embodiment of the invention.

FIG. 17 is a diagram illustrating a vacuum planarizing apparatus, in accordance with an example embodiment of the invention. Referring to FIG. 17, there is shown a boat 1701, a plurality of die 1705, an interposer 1707, a substrate 1708, vacuum sealing rings 1709, vacuum channels 1711, a valve 1713, and a vacuum supply 1715.

In an example scenario, the boat 1701 comprises a vacuum system to flatten the partially assembled package comprising the plurality of die 1705, the interposer 1707, and the substrate 1708, which may comprise a packaging substrate, for example. The vacuum-mechanical system permits the partially assembled package to heat up in normal fashion, but when the partially assembled package has become flat, it resists the normal progression of the warpage, holding the partially assembled package in a flattened configuration during heating and then maintains that flatness of the silicon interposer 1707 and the substrate 1708 as temperatures increases.

The vacuum may be applied at room temperatures or slightly elevated temperatures utilizing the vacuum supply 1715 via the valve 1713 and the vacuum channels 1711, and may be held utilizing the high-temperature sealing rings 1709 so that the vacuum-mechanical boat 1701 may travel through a standard reflow furnace and still maintain sufficient vacuum to maintain interposer silicon top surface planarity.

Figure 18A:
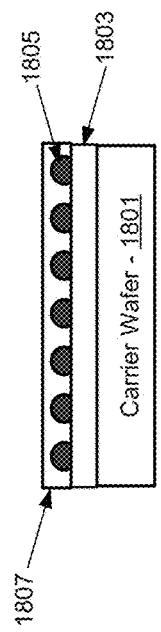
FIGS. 18A-18E illustrate steps for debonding wafers with large backside bumps, in accordance with an example embodiment of the invention.

FIGS. 18A-18E illustrate steps for debonding wafers with large backside bumps, in accordance with an example embodiment of the invention. Referring to FIG. 18A, there is shown a carrier wafer 1801, a device wafer 1803 with backside bumps 1805, and a polymer layer 1807.

The device wafer 1803 may comprise an electronics (i.e. functional) wafer or an interposer wafer, for example, which may comprise large backside bumps 1805 that may be susceptible to damage in debond processes. Accordingly, the polymer layer 1807 may be applied to protect the backside bumps 1105 during debond processes. The polymer layer 1807 may comprise a resist material or an adhesive film or tape, for example, that may be applied on the device wafer 1803 over the backside bumps 1805.

Figure 18B:
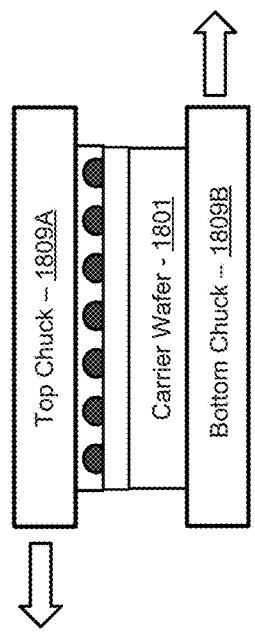

A subsequent chuck attachment, such as with a vacuum technique, to the carrier wafer 1801 and the top surface of the polymer layer 1807 is shown in FIG. 18B. The top chuck 1809A may be moved in one lateral direction while the bottom chuck 1809B may be moved in the opposite direction to separate the carrier wafer 1801 from the device wafer 1803. The polymer layer 1807 may enable a proper vacuum seal to the surface, where there may be a poor seal when applied directly to the backside bumps 1805.

Figure 18C:
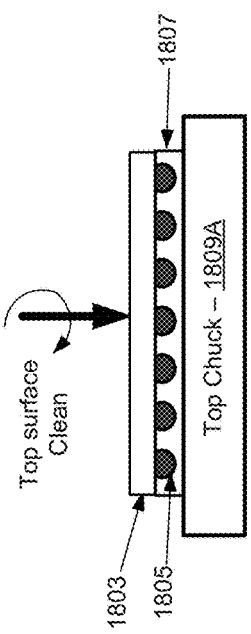

FIG. 18C shows the resulting structure following debond from the carrier wafer 1801. Any adhesive residue remaining from the carrier wafer 1801 may be removed in a cleaning process while still attached to the top chuck 1809A.

Figure 18D:
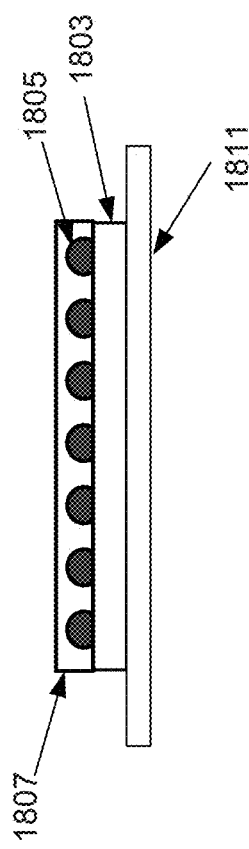
Figure 18E:
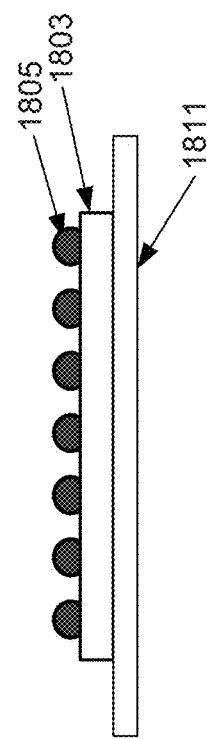

The cleaned structure may then be affixed to a film frame 1811 with the backside bumps 1805 facing up, as shown in FIG. 18D for example. The polymer layer 1807 may then be removed either chemically or thermally followed by a surface clean, resulting in the bonded wafer 1803 shown in FIG. 18E for example.

Figure 19:
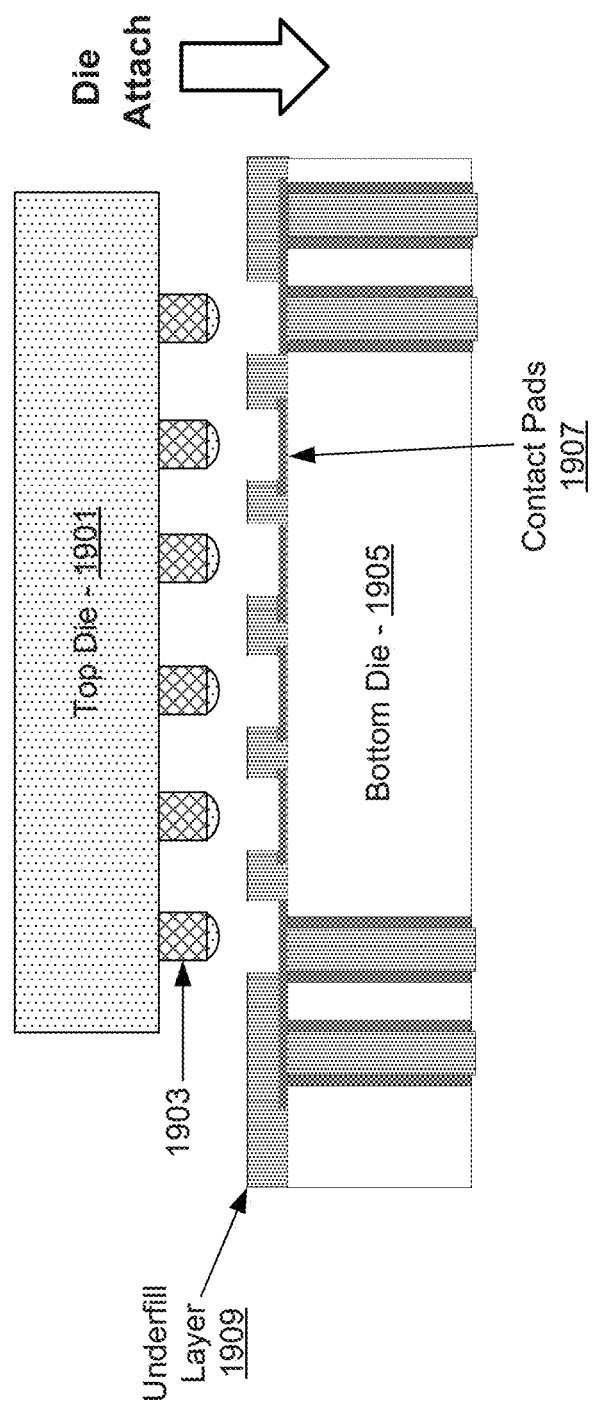
FIG. 19 is a diagram illustrating die-to-die bonding utilizing a patterned underfill layer, in accordance with an example embodiment of the invention.

FIG. 19 is a diagram illustrating die-to-die bonding utilizing a patterned underfill layer, in accordance with an embodiment of the invention. Referring to FIG. 19, there is shown a top die 1901 with microbumps 1903 and a bottom die 1905 comprising contact pads 1907 and an underfill layer 1909.

In an example scenario, the microbumps 1903 may comprise copper pillars, for example, and may correspond to the contact pads 1907 in the bottom die 1905. The underfill layer 1909 may comprise a polymer applied to the top surface of the bottom die 1905 that the next level die, the top die 1901, will be bonded to. The polymer may comprise a re-passivation or pre-applied underfill that will flow and bond to both die surfaces negating the need for subsequent underfill processes.

Furthermore, the underfill layer 1909 may be patterned utilizing photolithography techniques or laser ablation to expose the appropriate contact pads 1907 in the bottom die 1905 (e.g., by forming wells in the layer 1909). The layer 1909 may comprise a film where the openings may comprise full depth pockets or partial depth pockets, for example, generated using laser ablation or photolithography techniques. Material remaining in the partial depth pockets may assist in the bonding process of the top die 1901 to the bottom die 1905, for example.

The exposed pads may be utilized to align the top die 1901 to the bottom die 1905. The die may be bonded utilizing a thermal compression or mass reflow technique, for example. A flux dip may be utilized to aid in wetting of solder from one surface to the other and the underfill may "snap-cure" and seal to both top and bottom die surfaces. Furthermore the underfill may flow around and under the microbumps 1903 and the contact pads 1907 during the bond process.

In an example embodiment of the invention, a method and system are disclosed for a semiconductor device package with a die-to-packing substrate first bond. For purposes of this example, the interposer 807 of FIG. 8A-8B is termed a first die 807. In this regard, aspects of the invention may comprise bonding a first die 807, 1501A (e.g., a semiconductor die) to a packaging substrate 803, applying an underfill material 1101A, 1101B, 1503A between the first die 807, 1501A and the packaging substrate 803, and bonding one or more additional die 801, 1501B to the first die 807, 1501A.

The one or more additional die 801, 1501B may comprise electronic devices. The first die 807, 1501A may be an interposer (as discussed above) or may comprise electronic devices. The first die 807, 1501A may be bonded to the packaging substrate 803 utilizing a mass reflow process 1003A or a thermal compression process 1001B. The one or more additional die 801, 1501B may be bonded to the first die 807, 1501A utilizing a mass reflow process 1003B or a thermal compression process 1001B, 1007B. The bonded first die and the bonded one or more additional die may be encapsulated in a mold material 1521. The mold material 1521 may comprise a polymer. The one or more additional die 801, 1501B may comprise micro-bumps 809 for coupling to the first die 807, 1501A.

The first die 107, 1501A may be an interposer (as discussed above) bonded to the packaging substrate 803 utilizing a thermal compression process. The bonding of the one or more additional die 801, 1501B may comprise: adhering the one or more additional die 801, 1501B to an adhesive layer; and bonding the adhered one or more additional die 801, 1501B to the first die 807, 1501A.

The bonding of the one or more additional die 801, 1501B may comprise: placing the first die 807, 1501A and the packaging substrate in a fixture that allows the first die 807, 1501A and the packaging substrate to flex in one direction but not in an opposite direction; and processing the first die 807, 1501A, the packaging substrate, and the one or more additional die 801, 1501B through a reflow process.

Prior to the bonding of the die 807, 1501A to the packaging substrate: thinning a first substrate 1310, which comprises the first die 807, 1501A and is bonded to a support structure 1303, to expose through-silicon-vias 815 in said first die 807, 1501A; and removing the first interposer 1310 from the support structure 1303. The removing of the first substrate from the support structure 1303 may comprise: forming a protective, polymer layer 1807 over backside bumps 1805 on the first device wafer 1803; attaching a first chuck 1809A to the polymer layer 1807; attaching a second chuck 1809B to the carrier wafer 1801; and causing relative motion between the attached first chuck 1809A and the attached second chuck 1809B.

The bonded first die 807, 1501A and the bonded one or more additional die 801, 1501B may be encapsulated in a mold material 1521. The one or more additional die 801, 1501B, 1901 may comprise micro-bumps 809, 1903 for coupling to the first die 107, 1501A, 1905, wherein the bonding comprises: positioning the micro-bumps 1903 in respective wells in a layer 1909 disposed on the first die 807, 1501A, 1905; and bonding the micro-bumps 1903 to the first die 807, 1501A.

Certain aspects of the invention may be found in a method and system for a semiconductor device package with a die-to-die first bond. Example aspects of the invention may comprise bonding one or more semiconductor die comprising electronic devices to an interposer die. An underfill material may be applied between the one or more semiconductor die and the interposer die, and a mold material may be applied to encapsulate the one or more bonded semiconductor die. The interposer die may be thinned to expose through-silicon-vias (TSVs). Metal contacts may be applied to the exposed TSVs, and the interposer die with the bonded one or more semiconductor die may be bonded to a packaging substrate. The bonding of the one or more semiconductor die may comprise: adhering the one or more semiconductor die to an adhesive layer; and bonding the adhered one or more semiconductor die to the interposer die. The one or more semiconductor die may comprise micro-bumps for coupling to the interposer die, where the bonding comprises positioning the micro-bumps in respective wells in a layer disposed on the interposer die, and bonding the micro-bumps to the interposer die. The underfill material may be applied utilizing a capillary underfill process. The one or more semiconductor die may be bonded to the interposer die utilizing a mass reflow process or a thermal compression process. The one or more additional semiconductor die may be bonded to the one or more semiconductor die utilizing a mass reflow process. One or more additional semiconductor die may be bonded to the one or more semiconductor die utilizing a thermal compression process. The mold material may comprise a polymer. The bonding of the one or more semiconductor die may comprise placing the one or more semiconductor die and the interposer die in a fixture that allows the one or more semiconductor die and the interposer die to flex in one direction but not in an opposite direction, and processing the one or more semiconductor die and the interposer die through a reflow process.

Figure 20A:
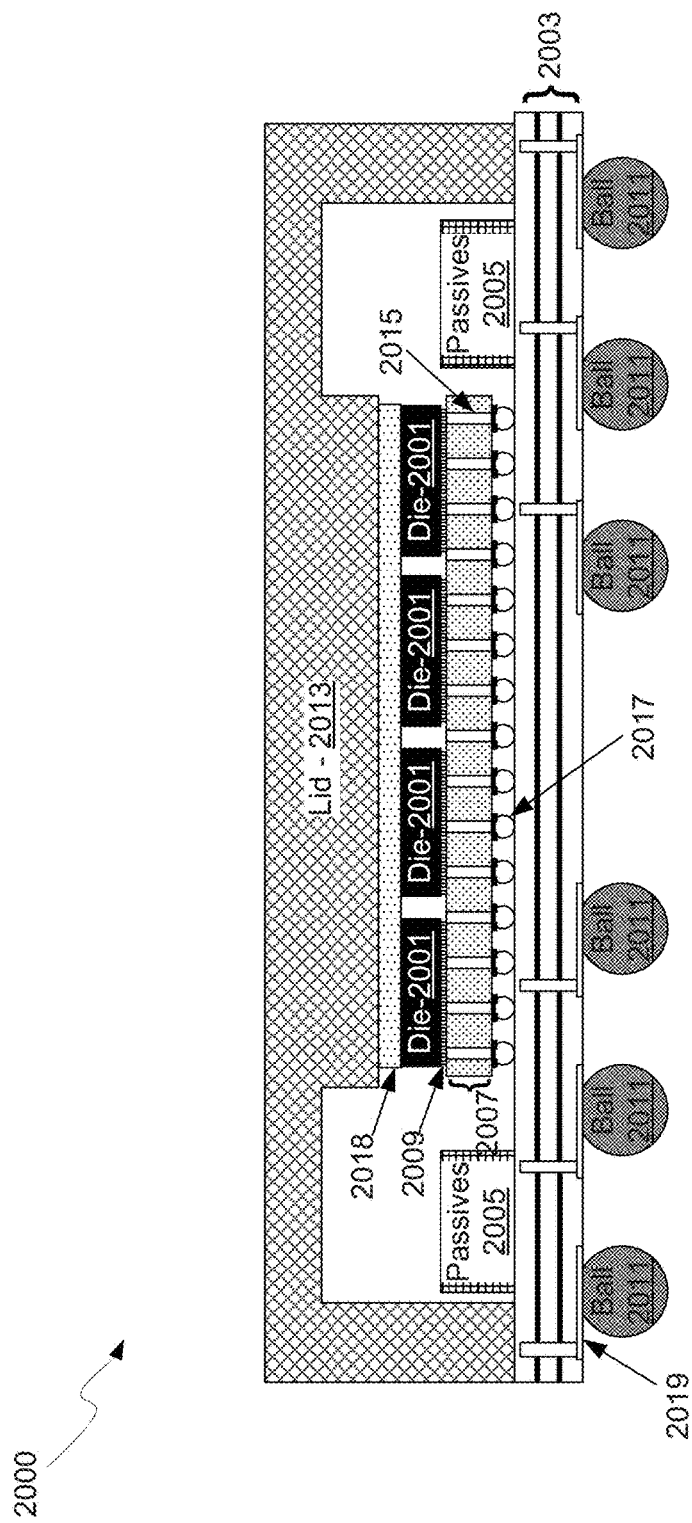
FIG. 20A is a schematic illustrating an integrated circuit package configured with a die-to-wafer first bond, in accordance with an example embodiment of the invention.

FIG. 20A is a schematic illustrating an integrated circuit package configured with a die-to-wafer first bond, in accordance with an example embodiment of the invention. Referring to FIG. 20A, there is shown a package 2000 comprising integrated circuit die 2001, a packaging substrate 2003, passive devices 2005, an interposer die 2007, solder balls 2011, a lid 2013, and thermal interface material 2018.

The die 2001 may comprise integrated circuit die that have been separated from one or more semiconductor wafers. The die 2001 may comprise electrical circuitry such as digital signal processors (DSPs), network processors, power management units, audio processors, RF circuitry, wireless baseband system-on-chip (SoC) processors, sensors, and application specific integrated circuits, for example. In addition, the plurality of die 2001 may comprise micro-bumps 2009 for providing electrical contact between the circuitry in the plurality of die 2001 and contact pads on the surface of the interposer die 2007.

The interposer die 2007 may comprise a semiconductor die, such as a silicon die, with through-silicon-vias (TSVs) 2015 that provide electrically conductive paths from one surface of the interposer die 2007 to the opposite surface. The interposer die 2007 may also comprise backside bumps 2017 for making electrical and mechanical contact to the packaging substrate 2003. In another example scenario, the interposer die 2007 may comprise glass or an organic laminate material, either of which may be capable of large panel formats on the order of 500×500 mm, for example.

The packaging substrate 2003 may comprise a mechanical support structure for the interposer die 2007, the die 2001, the passive devices 2005, and the lid 2013. The packaging substrate 2003 may comprise solder balls 2011 on the bottom surface for providing electrical contact to external devices and circuits, for example. The packaging substrate 2003 may also comprise conductive traces in a non-conductive material for providing conductive paths from the solder balls to the die 2001 via pads that are configured to receive the backside bumps 2017 on the interposer die 2007. Additionally, the packaging substrate 2003 may comprise pads 2019 for receiving the solder balls 2011. The pads 2019 may comprise one or more under-bump metals, for example, for providing a proper electrical and mechanical contact between the packaging substrate 2003 and the solder balls 2011.

The passive devices 2005 may comprise electrical devices such as resistors, capacitors, and inductors, for example, which may provide functionality to devices and circuits in the die 2001. The passive devices 2005 may comprise devices that may be difficult to integrate in the integrated circuits in the die 2001, such as high value capacitors or inductors. In another example scenario, the passive devices 2005 may comprise one or more crystal oscillators for providing one or more clock signals to the die 2001.

The lid 2013 may provide a hermetic seal for the devices within the cavity defined by the lid 2010 and the packaging substrate 2003. A thermal interface may be created for heat transfer out of the die 2001 to the lid 2013 via the thermal interface material 2018, which may also act as an adhesive.

In an example scenario, the package 2000 may be fabricated by first bonding the die 2001 to the interposer die 2007 when the interposer die 2007 comprises an individual die, and may be bonded utilizing a mass reflow or thermal compression process. In instances where the die 2001 are bonded using a mass reflow process, backside bumps on the interposer die 2007 might also be reflowed if present. Accordingly, the die 2001 may be bonded to the interposer die 2007 before the 2017 backside bumps are placed. The interposer die 2007 with attached die 2001 may be processed for further assembly. For example, the interposer die 2007 may be thinned (e.g., before or after the above-mentioned die-bonding) to expose the through-silicon-vias (TSVs) 2015, and the backside bumps 2017 may be deposited. Furthermore, a capillary underfill material may be placed between the die 2001 and the interposer die 2007 (e.g., in an example scenario in which underfilling with a non-conductive paste and/or tape is not performed during the bonding process) before a mold process is utilized to encapsulate the plurality of die 2001.

The assembly comprising the die 2001 and the interposer die 2007 may be processed as described above and the assembly may then be bonded to the packaging substrate 2003, utilizing either a mass reflow or thermal compression process, for example. The lid 2013 may be placed on the bonded assembly to provide a hermetic seal, to protect the circuitry from the external environment, and/or to serve as a heat sink. Finally, electrical tests may be performed following the bonding processes to verify that proper electrical connections were made and no shorts or open circuits exist.

Figure 20B:
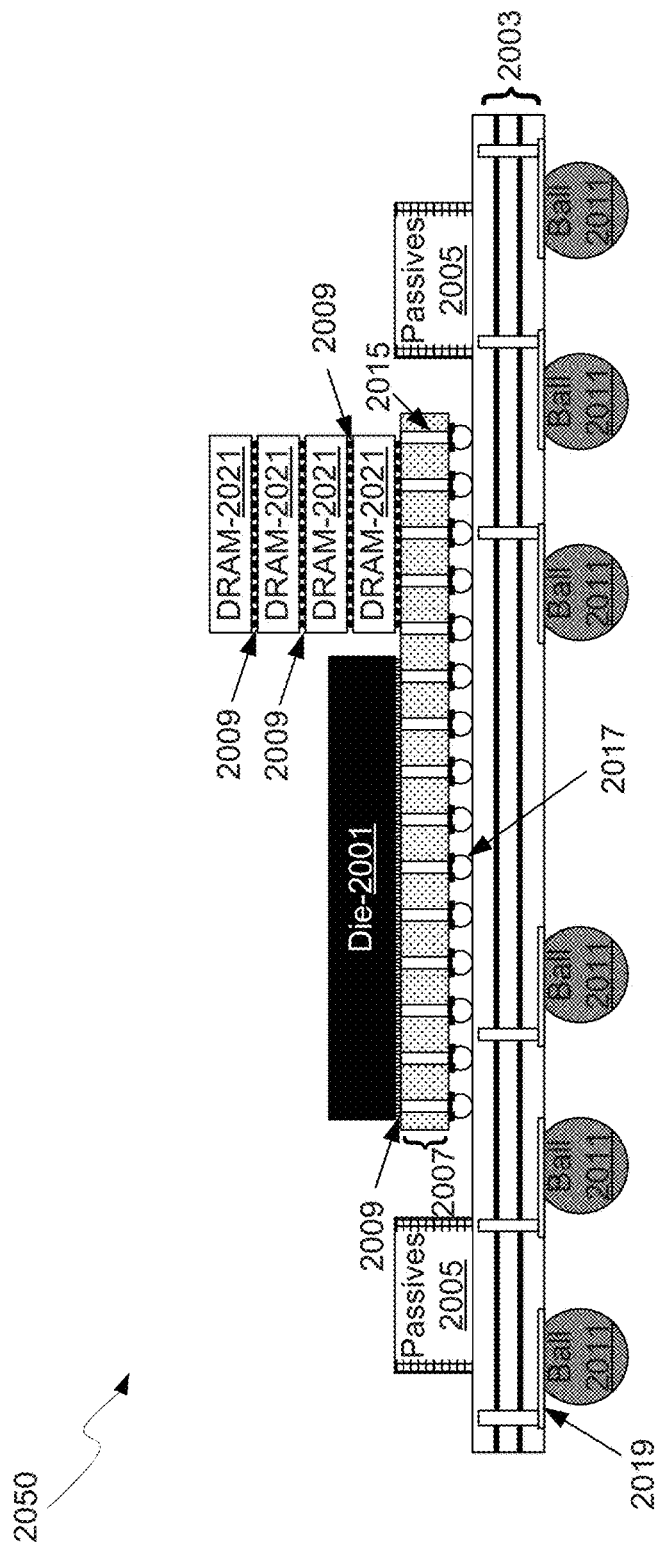
FIG. 20B is a schematic illustrating an integrated circuit package configured with an interposer-to-wafer first bond and stacked die, in accordance with an example embodiment of the invention.

FIG. 20B is a schematic illustrating an integrated circuit package configured with a die-to-die first bond and stacked die, in accordance with an example embodiment of the invention. Referring to FIG. 20B, there is shown a package 2050 comprising the die 2001, the packaging substrate 2003, the passive devices 2005, the interposer die 2007, and a stack of dynamic random access memory (DRAM) 2021. The die 2001, the packaging substrate 2003, the passive devices 2005, and the interposer die 2007 may be substantially as described with respect to FIG. 20A, for example, but with different electrical connectivity for the different die 2001 and the stack of DRAM 2021.

The DRAM 2021 may comprise a stack of die for providing a high density memory for circuitry in the die 2001 or external to the package 2050. The DRAM 2021 may be stacked front-to-back and therefore comprise TSV's for providing electrical connectivity between the individual die.

In an example scenario, the package 2050 may be fabricated by first bonding the die 2001 and the DRAM 2021 to the interposer die 2007 when in die form. The die 2001 and the DRAM 2021 may be bonded utilizing a mass reflow or thermal compression process. In an example scenario, the thermal compression process may utilize polymers, such as anisotropic films and/or conductive adhesives, for example.

In instances where the die 2001 and the stack of DRAM 2021 are bonded using a mass reflow process, backside bumps on the interposer die 2007 might also be reflowed if present at the time of the reflow process. Accordingly, the die 2001 and the stack of DRAM 2021 may be bonded to the interposer die 2007 before the 2017 backside bumps are placed. The interposer die 2007 with attached die 2001 and the stack of DRAM 2021 may be processed for further assembly. For example, the interposer die 2007 may be thinned to expose the through-silicon-vias (TSVs) 2015, and the backside bumps 2017 may be deposited. Furthermore, a capillary underfill material may be placed between the die 2001, the stack of DRAM 2021, and the interposer die 2007 (e.g., in an example scenario in which underfilling with a non-conductive paste and/or tape is not performed during the bonding process) before a mold process is utilized to encapsulate the die 2001 and stack of DRAM 2021.

Electrical tests may be performed following the bonding processes to verify that proper electrical connections were made and no shorts or open circuits exist. Also, as described previously with regard to FIG. 20A, the assembly may be bonded to the packaging substrate 2003 and then overmolded and/or lidded.

Figure 20C:
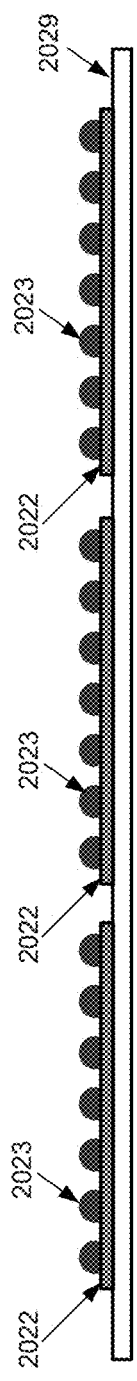
FIGS. 20C-20E illustrate steps for bonding multiple die utilizing an adhesive film, in accordance with an example embodiment of the invention.
Figure 20D:
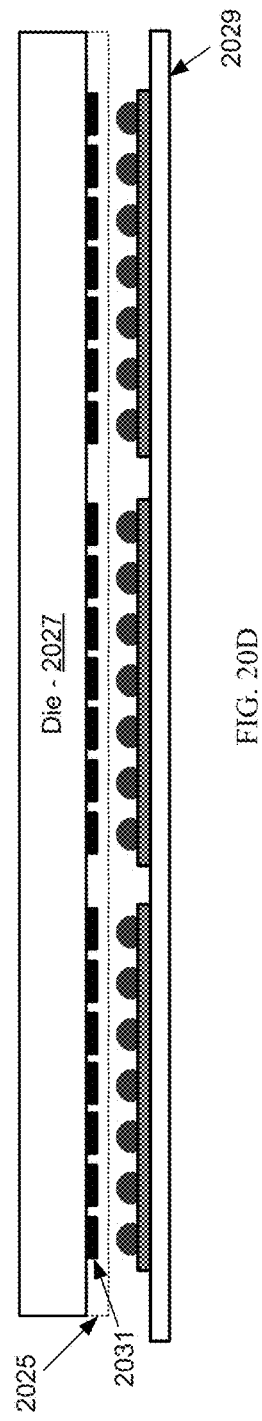
Figure 20E:
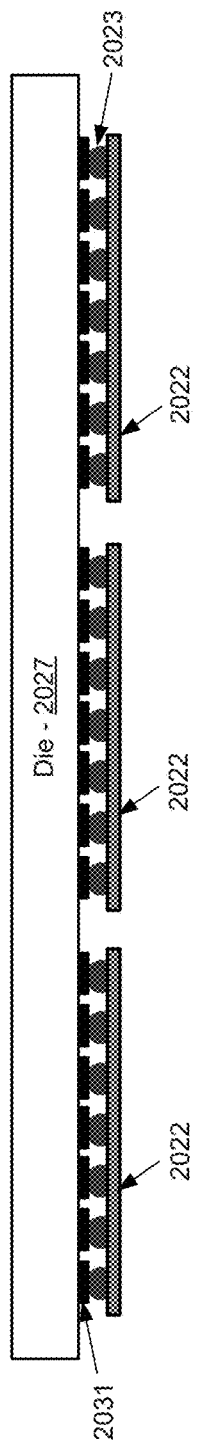

FIGS. 20C-20E illustrate steps for bonding multiple die utilizing an adhesive film, in accordance with an example embodiment of the invention. Referring to FIG. 20C, there is shown a plurality of die 2022 and an adhesive layer 2029. The die 2022 may comprise metal interconnects 2023 for subsequent bonding to other die. In another example scenario, the metal interconnects 2023 may comprise microbumps or copper pillars, for example.

The adhesive film 2029 may comprise an adhesive tape or compliant layer, for example, to which the die 2022 may be bonded, as illustrated in FIG. 20C for example. The adhesive film 2029 may be a temporary adhesive for attaching multiple die to one or more other die, for example. For example, the interposer 2027 may comprise an individual interposer die. In an example scenario, the die 2022 may be placed temporarily on the adhesive film 2029.

An optional underfill material 2025 may also be placed on the interposer 2027 as illustrated by underfill material 2025 in FIG. 20D, for example, before bonding the die 2022 to the interposer 2027 utilizing the adhesive film 2029. The underfill material 2025 may be used for subsequent thermal compression bonding processes, for example, and may allow instant underfill through a snap cure during a subsequent thermal compression bonding process. This may improve bonding yields since a single underfill process may be utilized for the plurality of die 2022 as compared to a separate place and underfill process for each of the die 2022 in a conventional process. The die 2022 may be placed face up so that the metal interconnects 2023 may be coupled to a receiving die.

The plurality of die 2022 on the adhesive film 2029 may then be placed on the interposer 2027, as shown in FIGS. 20D and 20E for example, where the initial placement of the die 2022 on the adhesive film 2029 may enable fine control of the spacing and alignment of the die 2022 with the interposer 2027. In an example scenario, the interposer 2027 may be gang bonded to the die 2022. The interposer 2027 may comprise metal pads 2031 for receiving the metal interconnects 2023. Once the die 2022 are placed on the interposer 2027, a thermal compression bond process may be performed for proper electrical and mechanical bonds between the metal interconnects 2023 and the metal pads 2031. Once bonded, the adhesive film 2029 may be removed resulting in the structure shown in FIG. 20E.

Figure 21A:
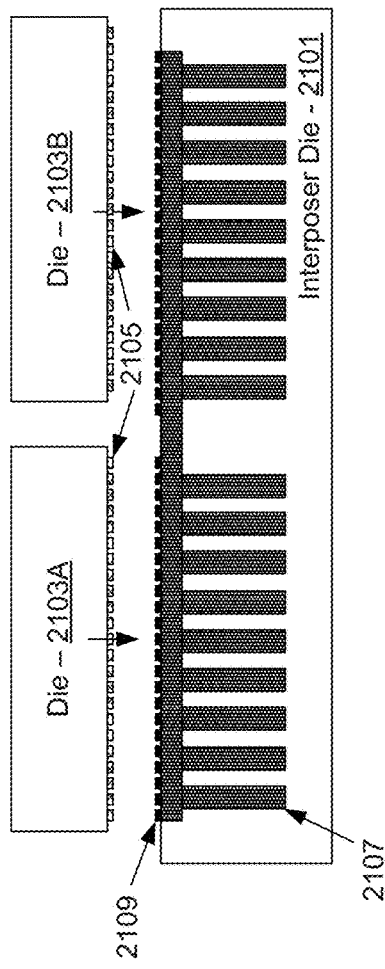
FIGS. 21A-21F illustrate steps in a die-to-die first bond structure, in accordance with an example embodiment of the invention.

FIGS. 21A-21F illustrate steps in a die-to-die first bond structure, in accordance with an example embodiment of the invention. Referring to FIG. 21A, there is shown an interposer die 2101 and a plurality of semiconductor die 2103A and 2103B. The semiconductor die 2103A and 2103B may comprise integrated circuit die that have been separated from one or more semiconductor wafers. The semiconductor die 2103A and 2103B may comprise electrical circuitry such as digital signal processors (DSPs), network processors, power management units, audio processors, RF circuitry, wireless baseband system-on-chip (SoC) processors, sensors, and application specific integrated circuits, for example.

In addition, the semiconductor die 2103A and 2103B may comprise micro-bumps 2105 for providing electrical contact between the circuitry in the semiconductor die 2103A and 2103B and front side pads 2109 on the surface of the interposer die 2101. While two die are shown in FIGS. 21A-21F, the invention is not so limited, as any number of die may be bonded to the interposer die 2101 dependent on chip area.

The interposer die 2101 may comprise front side pads 2109 for providing electrical contact to the semiconductor die 2103A and 2103B. Furthermore, the interposer die 2101 may comprise through-silicon-vias (TSVs) 2107 for providing electrically conductive paths from one surface of the interposer to the other, for example, once the interposer die 2101 has been thinned.

Figure 21B:
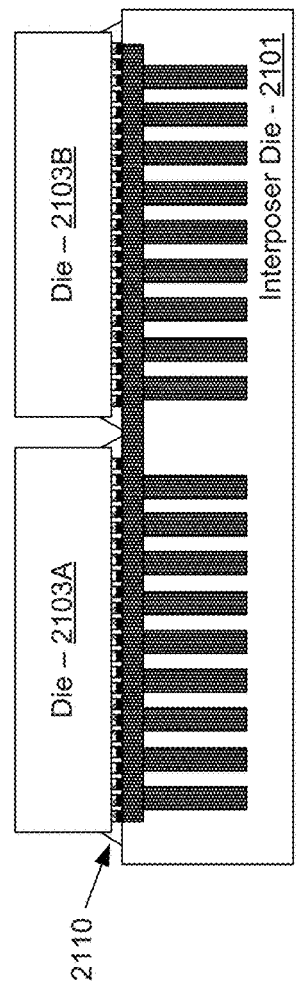

The semiconductor die 2103A and 2103B may be placed on the interposer die 2101 and bonded using a thermal compression bonding technique, for example. In another example scenario, a mass reflow process may be utilized to bond the semiconductor die 2103A and 2103B. A non-conductive paste (NCP) may also be utilized to assist in forming the bonds. In addition, a capillary underfill may then be applied and may fill the volume between the semiconductor die 2103A and 2103B and the interposer die 2101. FIG. 21B illustrates the semiconductor die 2103A and 2103B bonded to the interposer die 2101 with underfill material 2110. When deposited or placed, the underfill material 2110 may comprise a film, paste, b-stage film, or a liquid, for example.

Figure 21C:
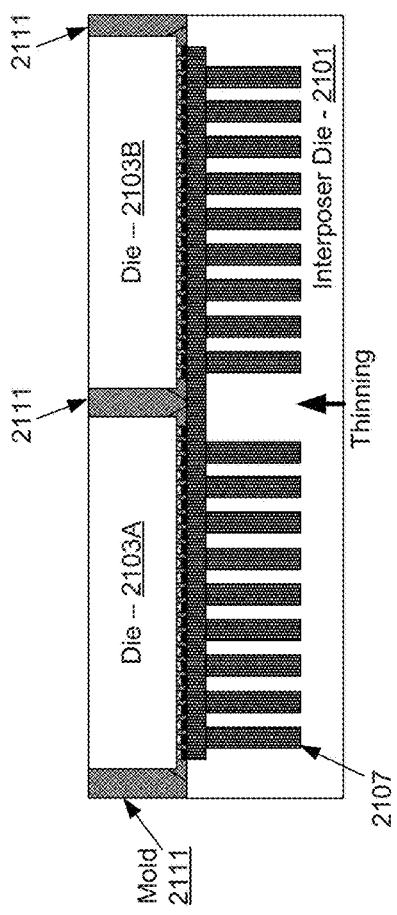

The space between and/or around the respective perimeters of the semiconductor die 2103A and 2103B may be filled with a mold material 2111, as illustrated in FIG. 21C for example. The mold material 2111 may comprise a polymer material, for example, that may provide a non-conductive structural support for die bonded to the interposer die 2101, protecting the die in subsequent processing steps. Note that the mold material 2111, in various example scenarios, may cover the top of one or more of the semiconductor die 2103A and 2103B. In an example scenario, the interposer die 2101 may be thinned utilizing a back side polish or grind, for example, to expose the TSVs 2107.

While the underfill material 2110 is shown in FIGS. 21B-21F, the mold material itself may be utilized as underfill material for each coupling interface, such as between the die 2103A and 2103B and the interposer die 2101. In another example embodiment, underfill material may be inserted as a liquid or paste, placed as a film, or a b-staged film and may be placed sequentially as each die to substrate or die to die bond is made, or may be made all at one time after all the electrical bonds are made.

In another example scenario, the interposer die 2101 may be thinned to a thickness where the TSVs are still slightly covered, which may then be etched selectively in areas covering the TSVs. A protective layer may then be deposited over the remaining silicon and a polish of the exposed metal may be performed for improved contact to the TSVs 2107. Additionally, metal pads may be deposited on the polished TSV surfaces for better contact with the backside bumps 2113.

In another example scenario, the interposer die 2101 may already be thinned and comprise the backside bumps 2113 prior to receiving the semiconductor die 2103A and 2103B. In this case, structural supports, adhesive films, and film frames, such as is illustrated in FIGS. 25A-25E, for example, may be utilized to process the interposer die 2101.

Figure 21D:
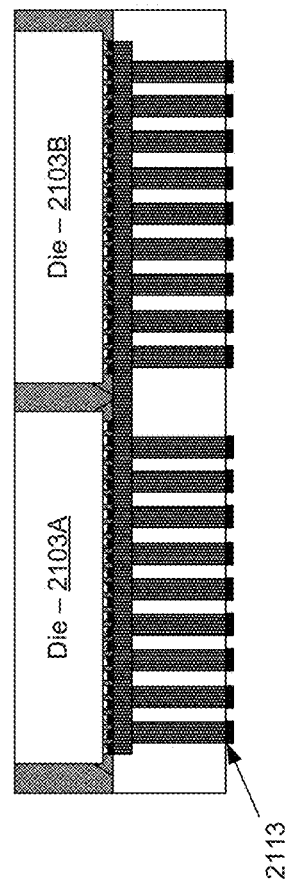

After the interposer die 2101 has been thinned, the backside bumps 2113 may be deposited, as shown in FIG. 21D, for making contact between the TSVs 2107 and subsequently bonded substrates, such as, for example, packaging substrates.

Figure 21E:
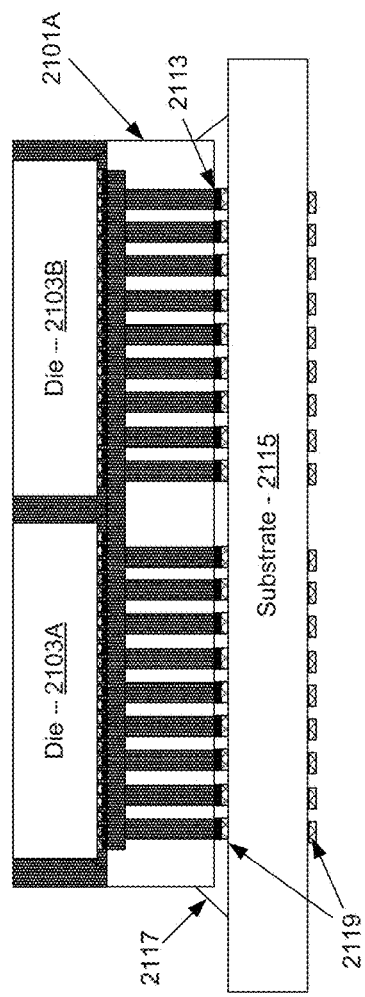
Figure 21F:
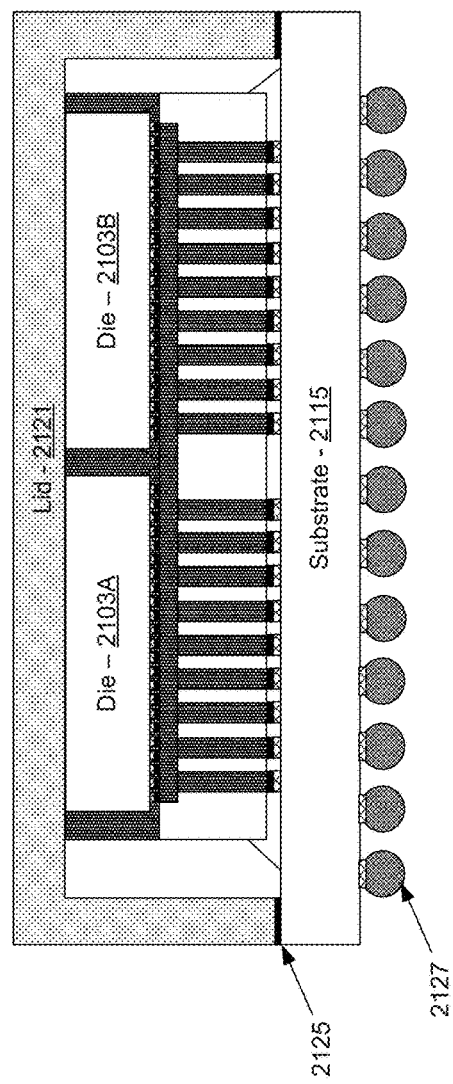

The assembly comprising the semiconductor die 2103A and 2103B and the interposer die 2101 may then be bonded to the packaging substrate 2115 via the backside bumps 2113, as illustrated in FIG. 21E. The packaging substrate 2115 may comprise a mechanical support structure for die assemblies and may also support passive devices and a lid, for example. The packaging substrate 2115 may comprise contact pads 2119 for making contact with the backside bumps 2113 on the interposer die 2101 and also for subsequent placement of solder balls 2027 (or alternative structures) as shown in FIG. 21F.

In addition, the lid 2123 may be placed on the package assembly with a hermetic seal made with an adhesive 2125 at the surface of the packaging substrate 2115, which may also comprise a thermal interface material. Accordingly, the lid 2121 may make contact with the top surfaces of the semiconductor die 2103A and 2103B (e.g., directly or through a thermal interface material) for thermal heat sinking purposes. The solder balls 2127 may comprise metal spheres for making electrical and mechanical contact with a printed circuit board, for example.

Figure 22:
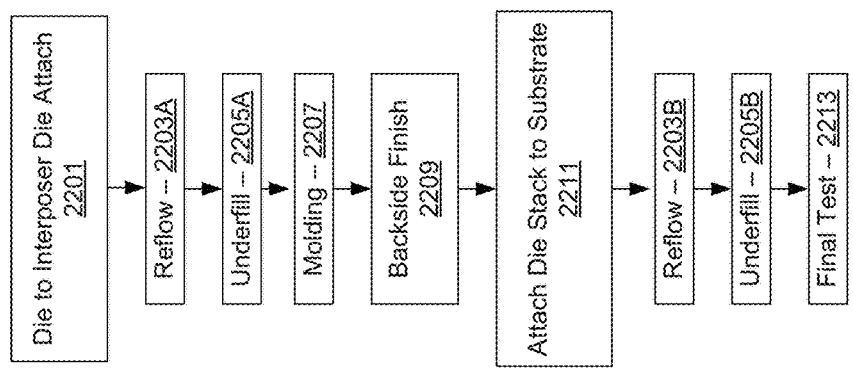
FIG. 22 is a schematic illustrating steps in a die-to-die first bond process, in accordance with an example embodiment of the invention.

FIG. 22 is a schematic illustrating steps in a die-to-die first bond process, in accordance with an example embodiment of the invention. Referring to FIG. 22, there is shown a die-to-die process beginning with a die to interposer die attach step 2201. The one or more die may be bonded utilizing a thermal compression bonding technique or a mass reflow process, for example. In the example shown in FIG. 22, a mass reflow process is utilized. Additional die may also be bonded to the first bonded die, such as illustrated by the DRAM stack 2021 shown in FIG. 20B, or the interposer wafer as shown in FIG. 20A.

After the die are placed on the interposer die, the assembly may then be subjected to a reflow process 2203A, where the assembly may be heated to provide a suitable electrical and mechanical connection between metal interconnects. An underfill process 2205A may be utilized following the bonding process (e.g., in an example scenario in which underfilling did not occur during the bonding process), which may provide an insulating barrier between contacts and may fill the volume between the die and the interposer wafer.

A molding step 2207 may then be utilized to package the die/interposer assembly, for example, before thinning the interposer die to expose the TSVs in the backside finish step 2209. In addition, backside contacts may be applied to the exposed TSVs in the interposer wafer (e.g., in an example scenario in which such contacts had not been previously formed).

Once the backside contacts are placed, the assembly may be attached to a packaging substrate in the attach die stack to substrate step 2211. This may be followed by a second reflow step 2203B for creating proper electrical and mechanical bonds to the packaging substrate and an underfill step 2205B for filling the volume between the die and interposer assembly and the packaging substrate. Finally, the bonded package may be subjected to a final test step 2213 for assessing the performance of the electronic circuitry in the bonded die and to test the electrical contacts made in the bonding processes.

Figure 23:
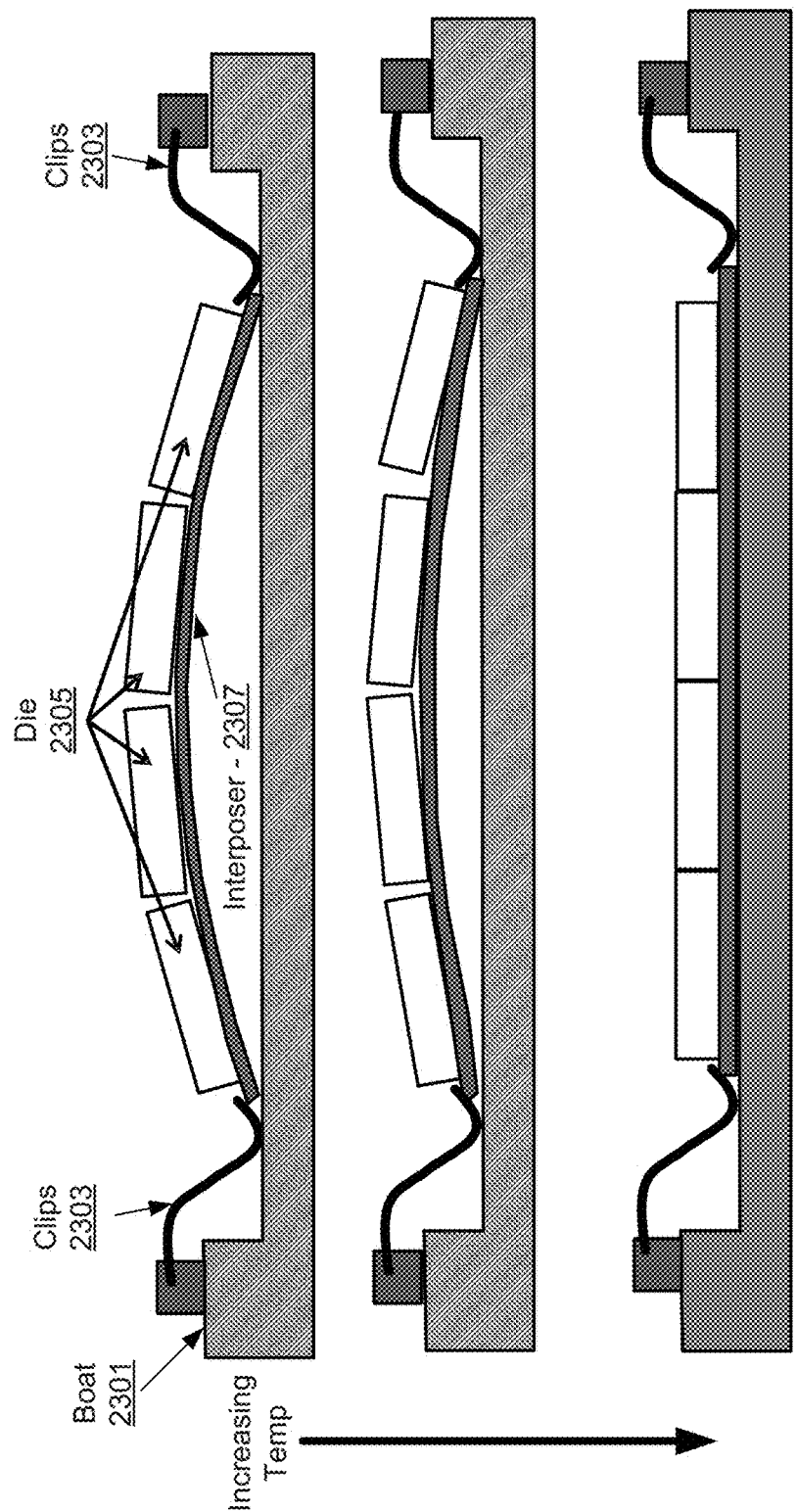
FIG. 23 is a diagram illustrating a mechanical planarizing apparatus, in accordance with an example embodiment of the invention.

FIG. 23 is a diagram illustrating a mechanical planarizing apparatus, in accordance with an example embodiment of the invention. Referring to FIG. 23, there is shown a boat 2301, clips 2303, a plurality of semiconductor die 2305, and an interposer 2307, where the interposer 2307 may be in die form. The boat 2301 may comprise a rigid support structure, or fixture, in which a die/interposer assembly may be placed and held in place by the clips 2303. The boat 2301 may be capable of withstanding high temperatures, above 200 C, for example used for processing the die/interposer assembly.

The plurality of semiconductor die 2305 may be bonded to the interposer 2307, when in die form, via a thermal compression bonding, technique, for example, prior to being placed in the boat 2301. As the temperature of the boat 2301, the plurality of semiconductor die 2305, and the interposer 2307 increases, the curvature of an assembly comprising the plurality of semiconductor die 2305 and the interposer 2307 may flatten with the clips 2303 providing a downward force at the outer edges of the assembly. As the curvature approaches zero, the increased length in the lateral direction may be accommodated by the sliding of the assembly under the clips 2303. In addition, the boat 2301 provides mechanical support in conjunction with the downward force of the clips 2303, thereby planarizing the assembly.

The boat 2301 and clips 2303 may permit the partially assembled package to heat up in normal fashion, but when the die/interposer assembly has become flat with increased temperature, the boat 2301 and clips 2303 resist the normal progression of the warpage, holding the partially assembled package, flattening it during heating and then maintaining that flatness of the silicon interposer as temperatures climb higher.

Figure 24:
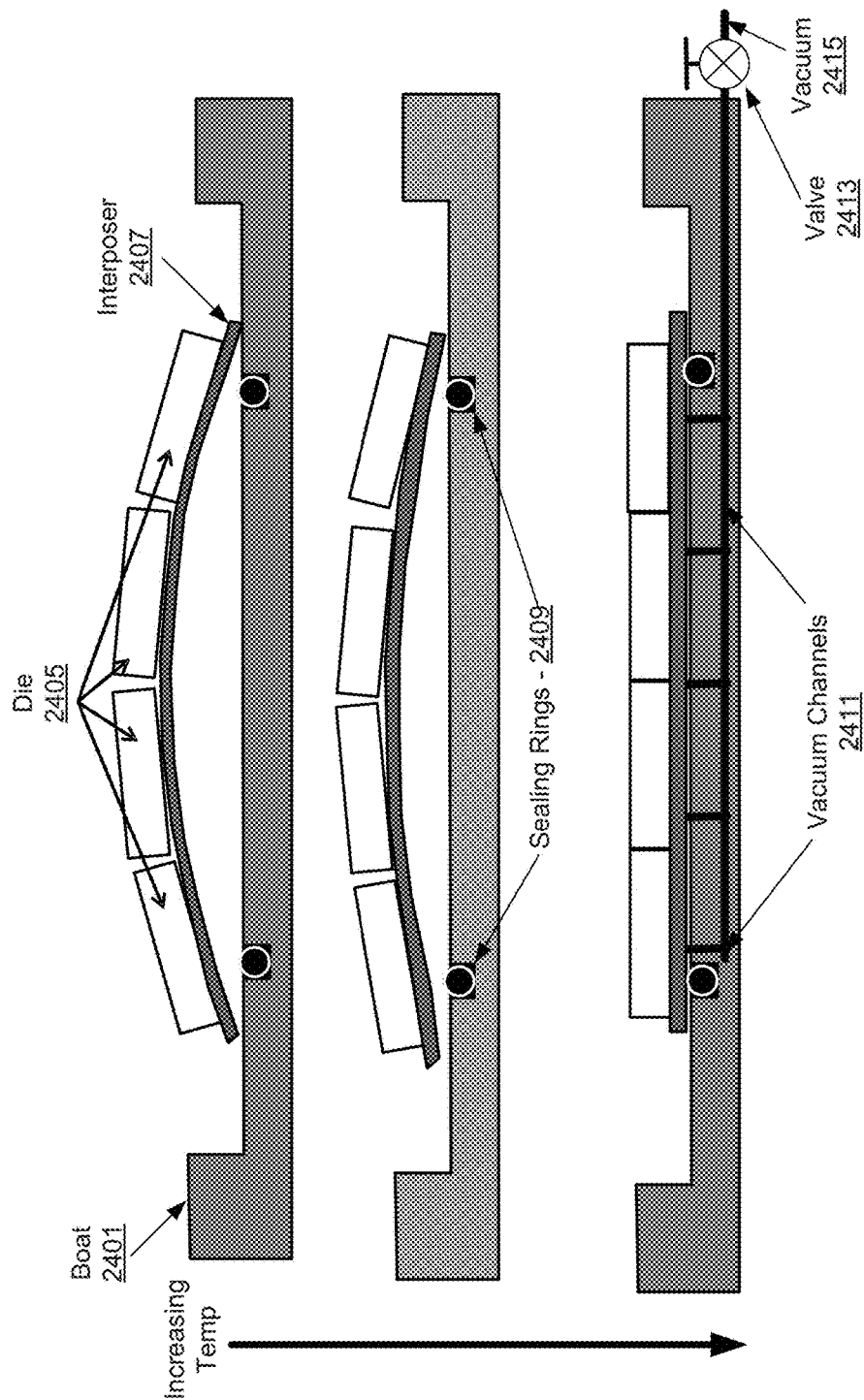
FIG. 24 is a diagram illustrating a vacuum planarizing apparatus, in accordance with an example embodiment of the invention.

FIG. 24 is a diagram illustrating a vacuum planarizing apparatus, in accordance with an example embodiment of the invention. Referring to FIG. 24, there is shown a boat 2401, a plurality of semiconductor die 2405, an interposer 2407, vacuum sealing rings 2409, vacuum channels 2411, a valve 2413, and a vacuum supply 2415.

In an example scenario, the boat 2401 may comprise a vacuum system, or fixture, to flatten the partially assembled package comprising the plurality of semiconductor die 2405 and the interposer 2407 when in die form. The vacuum-mechanical system permits the partially assembled package to heat up in normal fashion, but when the partially assembled package has become flat, the vacuum-mechanical system resists the normal progression of the warpage, holding the partially assembled package in a flattened configuration during heating and then maintains that flatness of the silicon interposer die 2407 as temperatures increases.

The vacuum may be applied at room temperature or slightly elevated temperatures utilizing the vacuum supply 2415 via the valve 2413 and the vacuum channels 2411, and may be held utilizing the high-temperature sealing rings 2409 so that the vacuum-mechanical boat 2401 may travel through a standard reflow furnace and still maintain a sufficient vacuum to maintain interposer silicon top surface planarity.

Figure 25A:
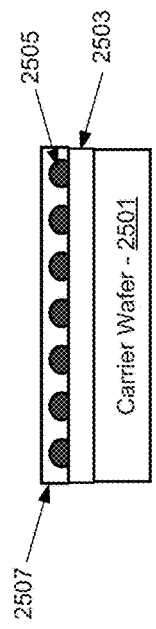

FIGS. 25A-25E illustrate example steps for debonding wafers with large backside bumps, in accordance with an example embodiment of the invention. Referring to FIG. 25A, there is show a carrier wafer 2501, a wafer 2503 with backside bumps 2505, and a polymer layer 2507.

The wafer 2503 may comprise an electronics wafer or an interposer wafer, for example, which may comprise large backside bumps 2505 that may be susceptible to damage in debond processes. Accordingly, the polymer layer 2507 may be applied to protect the backside bumps 2505 during debond processes. The polymer layer 2507 may comprise a resist material or an adhesive film or tape, for example, which may be applied on the device wafer 2503 over the backside bumps 2505. While wafers are shown in FIG. 25A, the technique may also be utilized on die.

Figure 25B:
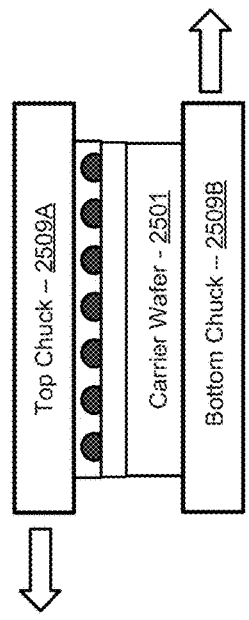

A subsequent chuck attachment, such as with a vacuum technique, to the carrier wafer 2501 and the top surface of the polymer layer 2507 is shown in FIG. 25B. The top chuck 2509A may be moved in one lateral direction while the bottom chuck 2509B may be moved in the opposite direction to separate the carrier wafer 2501 from the wafer 2503. The polymer layer 2507 may enable a proper vacuum seal to the surface, where there may be a poor seal when applied directly to the backside bumps 2505.

Figure 25C:
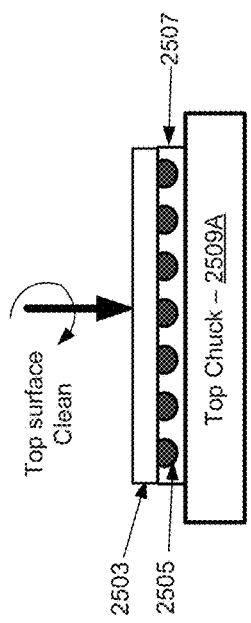

FIG. 25C shows a resulting structure following debond from the carrier wafer 2501. Any adhesive residue remaining from the carrier wafer 2501 may be removed in a cleaning process while still attached to the top chuck 2509A.

The cleaned structure may then be affixed to a film frame 2511 with the backside bumps 2505 facing up and being detached from the top chuck 2509A, as shown in FIG. 25D. The polymer layer 2507 may then be removed either chemically or thermally, and thereafter may undergo a surface clean, resulting in the bonded wafer 2503 shown in FIG. 25E, for example. The film frame 2511 may enable further processing and ease of transport for the bonded wafer 2503.

Figure 26:
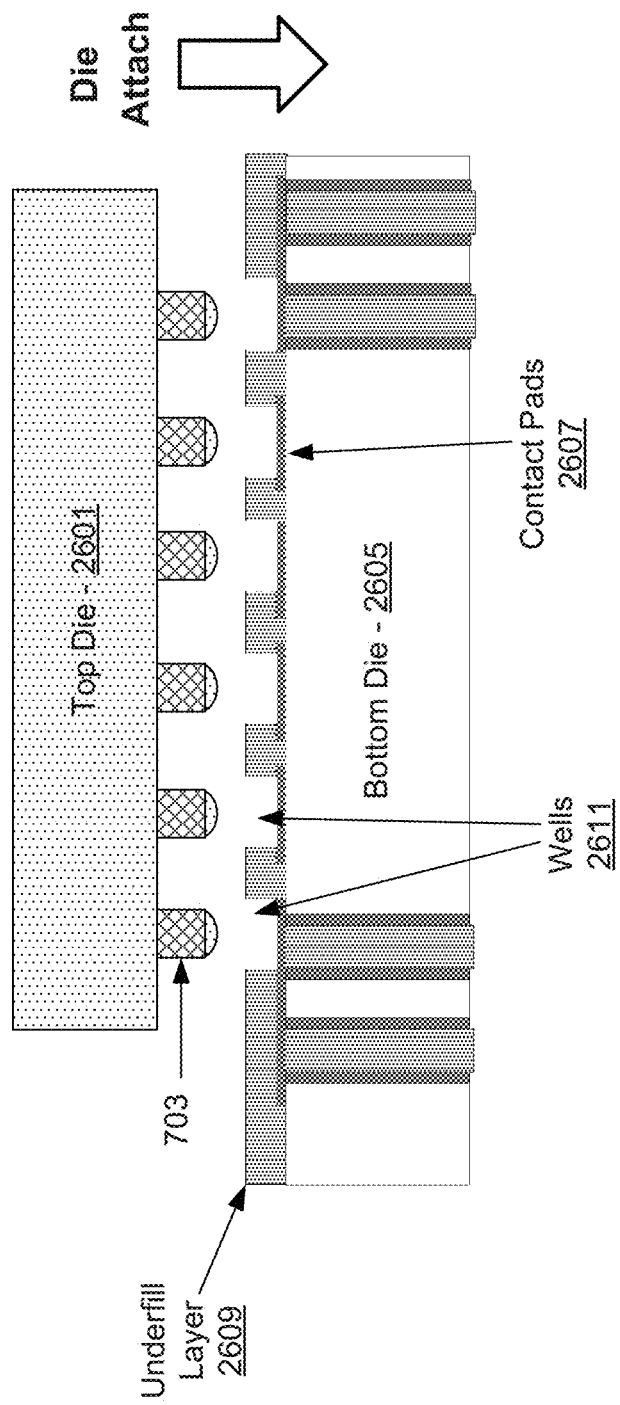
FIG. 26 is a diagram illustrating die bonding utilizing a patterned underfill layer, in accordance with an example embodiment of the invention.

FIG. 26 is a diagram illustrating die bonding utilizing a patterned underfill layer, in accordance with an example embodiment of the invention. Referring to FIG. 26, there is shown a top semiconductor die 2601 with microbumps 2603 and a bottom semiconductor die 2605 comprising contact pads 2607 and an underfill layer 2609.

In an example scenario, the microbumps 2603 may comprise copper pillars, for example, and may correspond to the contact pads 2607 in the bottom semiconductor die 2605. Although the bottom semiconductor die 2605 is shown as a single die, in another example scenario, it may comprise an entire wafer of die (e.g., an interposer wafer), with a plurality of top semiconductor die 2601 being bonded to the wafer as opposed to a single die. In an example scenario, the bottom semiconductor die 2605 comprises a single interposer die. The underfill layer 2609 may comprise a polymer applied to the top surface of the bottom semiconductor die 2605 to which the next level die, e.g., the top semiconductor die 2601, will be bonded. The polymer may comprise a re-passivation or pre-applied underfill that will flow and bond to both die surfaces negating the need for subsequent underfill processes.

Furthermore, the underfill layer 2609 may be patterned utilizing photolithography techniques or laser ablation to create the wells 2611 thereby exposing the appropriate contact pads 2607 in the bottom semiconductor die 2605, for example by forming wells in the underfill layer 2609. The underfill layer 2609 may comprise a film where the openings may comprise full depth pockets or partial depth pockets, for example, generated using laser ablation or photolithography techniques. Material remaining in the partial depth pockets may assist in the bonding process of the top die 2601 to the bottom die 2605, for example.

The exposed pads may be utilized to align the top semiconductor die 2601 to the bottom semiconductor die 2605. The die may be bonded utilizing a thermal compression or mass reflow technique, for example. A flux dip may be utilized to aid in wetting of solder from one surface to the other and the underfill may "snap-cure" and seal both to the top and bottom die surfaces. Furthermore, the underfill may flow around and under the microbumps 2603 and the contact pads 2607 during the bond process.

In an example embodiment of the invention, methods are disclosed for a semiconductor device package with a die-to-die first bond. In this regard, aspects of the invention may comprise bonding one or more semiconductor die 2001, 2021, 2103A, 2103B, 2305, 2405, 2601 comprising electronic devices to an interposer die 2007, 2101. An underfill material 2110 may be applied between the one or more semiconductor die 2001, 2021, 2103A, 2103B, 2305, 2405, 2601 and the interposer die 2007, 2101, and a mold material 2111 may be applied to encapsulate the one or more bonded semiconductor die 2001, 2021, 2103A, 2103B, 2305, 2405, 2601. The interposer die 2007, 2101, and 2605 in instances where the bottom semiconductor die 2605 comprises an interposer die, may be thinned to expose through-silicon-vias (TSVs) 2015, 2107. Metal contacts 2113 may be applied to the exposed TSVs 2015, 2107 and the interposer die 2007, 2101, and 2605 in instances where the bottom semiconductor die 2605 comprises an interposer die, with the bonded one or more semiconductor die 2001, 2021, 2103A, 2103B, 2305, 2405, 2601 be bonded may to a packaging substrate 2003, 2115.

The bonding of the one or more semiconductor die 2001, 2021, 2103A, 2103B, 2305, 2405, 2601 may comprise: adhering the one or more semiconductor die 2001, 2021, 2103A, 2103B, 2305, 2405, 2601 to an adhesive layer 2511; and bonding the adhered one or more semiconductor die 2001, 2021, 2103A, 2103B, 2305, 2405, 2601 to the interposer die 2007, 2101, and 2605 in instances where the bottom semiconductor die 2605 comprises an interposer die. The one or more semiconductor die 2001, 2021, 2103A, 2103B, 2305, 2405, 2601 may comprise micro-bumps 2009, 2105, 2603 for coupling to the interposer die 2007, 2101, and 2605 in instances where the bottom semiconductor die 2605 comprises an interposer die, wherein the bonding comprises: positioning the micro-bumps 2009, 2105, 2603 in respective wells 2611 in a layer 2609 disposed on the interposer die 2007, 2101, and 2605 in instances where the bottom semiconductor die 2605 comprises an interposer die, and bonding the micro-bumps 2009, 2105, 2603 to the interposer die 2007, 2101, and 2605 in instances where the bottom semiconductor die 2605 comprises an interposer die. The underfill material 2110 may be applied utilizing a capillary underfill process. The one or more semiconductor die may 2001, 2021, 2103A, 2103B, 2305, 2405, 2601 be bonded to the interposer die 2007, 2101, and 2605 in instances where the bottom semiconductor die 2605 comprises an interposer die, utilizing a mass reflow process or a thermal compression process.

One or more additional semiconductor die 2121, 2601 may be bonded to the one or more semiconductor die 2001, 2021, 2103A, 2103B, 2305, 2405, 2601 utilizing a mass reflow process. The one or more additional semiconductor die 2021, 2601 may be bonded to the one or more semiconductor die 2001, 2021, 2103A, 2103B, 2305, 2405, 2601 utilizing a thermal compression process. The mold material 2111 may comprise a polymer. The bonding of the one or more semiconductor die 2001, 2021, 2103A, 2103B, 2305, 2405, 2601 may comprise: placing the one or more semiconductor die 2001, 2021, 2103A, 2103B, 2305, 2405, 2601 and the interposer die 2007, 2101, and 2605 in instances where the bottom semiconductor die 2605 comprises an interposer die, in a fixture 2301, 2401 that allows the one or more semiconductor die and the interposer die 2007, 2101, and 2605 in instances where the bottom semiconductor die 2605 comprises an interposer die, to flex in one direction but not in an opposite direction; and processing the one or more semiconductor die 2001, 2021, 2103A, 2103B, 2305, 2405, 2601 and the interposer die 2007, 2101, and 2605 in instances where the bottom semiconductor die 2605 comprises an interposer die, through a reflow process.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A semiconductor device comprising:
   an interposer comprising:
      an interposer top surface comprising interposer top side contacts;
      an interposer bottom surface comprising interposer bottom side contacts;
      a plurality of interposer side surfaces between the interposer top surface and the interposer bottom surface; and
      a plurality of interposer conductive paths, each electrically connecting a respective one of the interposer top side contacts with a respective one of the interposer bottom side contacts;
   a plurality of functional die, each comprising:
      a die top surface;
      a die bottom surface comprising die bottom side contacts, each electrically connected to a respective one of the interposer top side contacts; and
      a plurality of die side surfaces between the die top surface and the die bottom surface;
   a first underfill material between each of the plurality of functional die and the interposer, wherein the interposer top surface is entirely covered by one or more of: the plurality of functional die and/or the first underfill material;
   a substrate comprising:
      a substrate top surface comprising substrate top side contacts, each electrically connected to a respective one of the interposer bottom side contacts;
      a substrate bottom surface comprising substrate bottom side contacts;
      a plurality of substrate side surfaces between the substrate top surface and the substrate bottom surface; and
      a plurality of substrate conductive paths, each electrically connecting a respective one of the substrate top side contacts with a respective one of the substrate bottom side contacts; and
   a molded encapsulant structure that encapsulates at least a portion of each of the die side surfaces and at least a portion of a top surface of the first underfill material, the molded encapsulant structure comprising: a molded encapsulant top surface, a molded encapsulant bottom surface, and a plurality of molded encapsulant side surfaces between the molded encapsulant top surface and the molded encapsulant bottom surface.

2. The semiconductor device of claim 1, wherein the interposer top surface is entirely covered by the die bottom side contacts and the first underfill.

3. The semiconductor device of claim 1, wherein each of the molded encapsulant side surfaces is coplanar with a respective one of the interposer side surfaces.

4. The semiconductor device of claim 1, comprising:
   a second underfill material between the interposer and the substrate; and
   a second encapsulant structure that encapsulates at least the molded encapsulant side surfaces, side surfaces of the second underfill material, and at least a portion of the substrate top surface.

5. The semiconductor device of claim 4, wherein the second encapsulant structure encapsulates the die top surface.

6. The semiconductor device of claim 4, wherein the molded encapsulant structure extends from the top surface of the first underfill material to the top die surfaces, and the second encapsulant structure extends from the substrate top surface to at least the molded encapsulant top surface.

7. The semiconductor device of claim 4, wherein the second underfill material is a different type of underfill than the first underfill material.

8. The semiconductor device of claim 4, wherein the second encapsulant structure comprises conductive material that is directly coupled to the substrate top surface and extends vertically from the substrate top surface to a top surface of the second encapsulant structure.

9. The semiconductor device of claim 1, wherein the interposer comprises a silicon die.

10. The semiconductor device of claim 1, wherein the molded encapsulant structure comprises a different type of material than the first underfill material.

11. A semiconductor device comprising:
    an interposer comprising:
       an interposer top surface comprising interposer top side contacts;
       an interposer bottom surface comprising interposer bottom side contacts;
       a plurality of interposer side surfaces between the interposer top surface and the interposer bottom surface; and
       a plurality of interposer conductive paths, each electrically connecting a respective one of the interposer top side contacts with a respective one of the interposer bottom side contacts;
    a plurality of functional die, each comprising:
       a die top surface;
       a die bottom surface comprising die bottom side contacts, each electrically connected to a respective one of the interposer top side contacts; and
       a plurality of die side surfaces between the die top surface and the die bottom surface;
    a first underfill material between each of the plurality of functional die and the interposer, wherein the first underfill material comprises a first underfill top surface, a first underfill bottom surface facing the interposer top surface, and a plurality of first underfill side surfaces between the first underfill top surface and the first underfill bottom surface, wherein each of the first underfill side surfaces is coplanar with a respective one of the interposer side surfaces;
    a substrate comprising:
       a substrate top surface comprising substrate top side contacts, each electrically connected to a respective one of the interposer bottom side contacts;
       a substrate bottom surface comprising substrate bottom side contacts;
       a plurality of substrate side surfaces between the substrate top surface and the substrate bottom surface; and
       a plurality of substrate conductive paths, each electrically connecting a respective one of the substrate top side contacts with a respective one of the substrate bottom side contacts; and
    a molded encapsulant structure that encapsulates at least a portion of each of the die side surfaces and at least a portion of the first underfill top surface, such that the first underfill top surface is entirely covered by one or more of: the molded encapsulant structure and/or the plurality of functional die, and the molded encapsulant structure comprises: a molded encapsulant top surface, a molded encapsulant bottom surface, and a plurality of molded encapsulant side surfaces between the molded encapsulant top surface and the molded encapsulant bottom surface.

12. The semiconductor device of claim 11, wherein the interposer top surface is entirely covered by one or more of: the die bottom side contacts and/or the first underfill.

13. The semiconductor device of claim 11, comprising:
a second underfill material between the interposer and the substrate; and
a second encapsulant structure that encapsulates at least the molded encapsulant side surfaces, side surfaces of the second underfill material, and at least a portion of the substrate top surface.

14. The semiconductor device of claim 13, wherein the second encapsulant structure encapsulates the die top surfaces.

15. The semiconductor device of claim 13, wherein the second underfill material is a different type of underfill than the first underfill material.

16. A semiconductor device comprising:
an interposer comprising:
  an interposer top surface comprising interposer top side contacts;
  an interposer bottom surface comprising interposer bottom side contacts;
  a plurality of interposer side surfaces between the interposer top surface and the interposer bottom surface; and
  a plurality of interposer conductive paths, each electrically connecting a respective one of the interposer top side contacts with a respective one of the interposer bottom side contacts;
a plurality of functional die, each comprising:
  a die top surface;
  a die bottom surface comprising die bottom side contacts, each electrically connected to a respective one of the interposer top side contacts; and
  a plurality of die side surfaces between the die top surface and the die bottom surface;
a substrate comprising:
  a substrate top surface comprising substrate top side contacts, each electrically connected to a respective one of the interposer bottom side contacts;
  a substrate bottom surface comprising substrate bottom side contacts;
  a plurality of substrate side surfaces between the substrate top surface and the substrate bottom surface; and
  a plurality of substrate conductive paths, each electrically connecting a respective one of the substrate top side contacts with a respective one of the substrate bottom side contacts;
a first encapsulant structure that encapsulates at least a portion of the die side surfaces and at least a portion of the interposer top surface, the first encapsulant structure comprising: a first encapsulant top surface, a first encapsulant bottom surface, and a plurality of first encapsulant side surfaces between the first encapsulant top surface and the first encapsulant bottom surface; and
a second encapsulant structure that encapsulates at least the first encapsulant side surfaces and at least a portion of the substrate top surface, wherein the second encapsulant structure comprises conductive material that is directly coupled to the substrate top surface and extends vertically from the substrate top surface to a top surface of the second encapsulant structure.

17. The semiconductor device of claim 16, wherein the second encapsulant structure encapsulates the die top surfaces.

18. The semiconductor device of claim 16, wherein the first encapsulant structure extends to the top die surfaces, and the second encapsulant structure extends from the substrate top surface to at least the first encapsulant top surface.

19. The semiconductor device of claim 16, comprising:
a first underfill material between the plurality of functional die and the interposer; and
a second underfill material between the interposer and the substrate, where the second underfill material is a different type of underfill than the first underfill material.

20. The semiconductor device of claim 16, wherein the conductive material of the second encapsulant structure is adhered to the substrate top surface.

* * * * *